United States Patent
Parker et al.

(10) Patent No.: US 8,339,138 B2
(45) Date of Patent: Dec. 25, 2012

(54) DYNAMIC COMPOSITE GRADIENT SYSTEMS FOR MRI

(75) Inventors: Dennis Lee Parker, Centerville, UT (US); John Rock Hadley, Centerville, UT (US); Kenneth Craig Goodrich, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 469 days.

(21) Appl. No.: 12/580,240

(22) Filed: Oct. 15, 2009

(65) Prior Publication Data

US 2010/0102815 A1    Apr. 29, 2010

Related U.S. Application Data

(60) Provisional application No. 61/105,766, filed on Oct. 15, 2008.

(51) Int. Cl.
*G01V 3/00* (2006.01)

(52) U.S. Cl. .................................. 324/318; 324/319

(58) Field of Classification Search .............. 324/318, 324/319, 320, 322
See application file for complete search history.

(56) References Cited

U.S. PATENT DOCUMENTS

| | | | |
|---|---|---|---|
| 5,235,279 A * | 8/1993 | Kaufman et al. | 324/309 |
| 5,311,134 A * | 5/1994 | Yamagata et al. | 324/318 |
| 5,485,087 A | 1/1996 | Morich et al. | |
| 5,736,858 A | 4/1998 | Katznelson et al. | |
| 5,783,943 A | 7/1998 | Mastandrea, Jr. et al. | |
| 6,198,282 B1 | 3/2001 | Dumoulin | |
| 6,445,184 B1 | 9/2002 | Tanttu | |
| 6,466,017 B1 * | 10/2002 | Ganin et al. | 324/318 |
| 6,777,936 B2 | 8/2004 | Schaaf | |
| 6,864,683 B2 * | 3/2005 | Schuster et al. | 324/318 |
| 6,882,152 B2 | 4/2005 | Schuster et al. | |
| 6,894,497 B2 | 5/2005 | Renz | |
| 7,042,220 B2 | 5/2006 | Truong et al. | |
| 7,112,965 B2 | 9/2006 | Scheffler et al. | |
| 7,250,765 B2 | 7/2007 | Dietz et al. | |

FOREIGN PATENT DOCUMENTS

| | | |
|---|---|---|
| EP | 0 924 530 | 12/1998 |
| WO | WO 2008/135879 | 11/2008 |
| WO | WO 2008/135885 | 11/2008 |

OTHER PUBLICATIONS

Goodrich, et al., Design, Fabrication, and Testing of an Insertable Double-Imaging-Region Gradient Coil, Magnetic Resonance Imaging, Jan. 30, 2009, vol. 35B, pp. 98-105, Salt Lake City, Utah. Parker, et al., Magnetic Resonance Imaging with Composite (Dual) Gradients, Magnetic Resonance Imaging, Feb. 23, 2009, vol. 35B, pp. 89-97, Salt Lake City, Utah.

* cited by examiner

*Primary Examiner* — Louis Arana
(74) *Attorney, Agent, or Firm* — James W. Hill; McDermott Will & Emery LLP

(57) ABSTRACT

A composite gradient system is described, including a body gradient system and an insert gradient system, in which the body gradient system and the insert gradient system can be driven independently and simultaneously. The composite gradient system can provide an operator with the flexibility of imaging a subject using the body gradient system alone, the insert gradient system alone, or both gradient systems simultaneously, and therefore enjoy the advantages of each gradient system. In some embodiments, the body gradient system and the insert gradient system may be driven concurrently during an imaging sequence to produce composite magnetic field gradients having high amplitude and/or fast slew rate, resulting in high image resolution and/or fast image acquisition. In some embodiments, a subject may be imaged using the body gradient system alone while leaving the insert gradient system in place.

13 Claims, 20 Drawing Sheets

DYNAMIC COMPOSITE GRADIENT SYSTEMS FOR MRI

RELATED APPLICATION

The present application claims the benefit of priority under 35 U.S.C. §119 from U.S. Provisional Patent Application Ser. No. 61/105,766, entitled "DYNAMIC MULTI-GRADIENT SYSTEMS FOR ADVANCED MRI," filed on Oct. 15, 2008, which is hereby incorporated by reference in its entirety for all purposes.

STATEMENT REGARDING FEDERALLY SPONSORED RESEARCH OR DEVELOPMENT

This invention was made with government support under Grant #EB004803 awarded by the National Institutes of Health. The government has certain rights in the invention.

FIELD OF THE INVENTIONS

The present disclosure relates to magnetic resonance imaging (MRI).

BACKGROUND OF THE INVENTIONS

In conventional gradient systems, gradient amplitude and speed are limitations in a number of important applications. Examples of MRI techniques where image quality is limited by gradient amplitudes and rise time limits include echoplanar (EPI), turbo spin echo (TSE), steady state free precession (SSFP), and dynamic contrast enhanced 3D gradient echo (DCE MRI) techniques. For EPI, which alternates polarity of the readout gradient to acquire all measurements for an image after a single excitation pulse, the minimum readout time is determined by the maximum gradient slew rate and amplitude. During readout, the magnetization decreases due to T2*decay, resulting in substantial image blurring and distortion. When operating at the gradient limits, increasing resolution requires a longer readout causing increased blurring and image distortion. Thus, gradient performance factors dictate a resolution limit for EPI sequences. Similar blurring problems occur for long echotrain TSE sequences where gradient performance can limit maximum spatial resolution or require shorter echotrains and longer scan times. Acquiring at higher resolutions requires longer echo times (TE) in nearly all conventional sequences, which can cause, at a minimum, a loss in SNR.

Gradient performance is a major limitation in achieving high spatial and temporal resolution in dynamic MRI techniques such as in DCE MRI of the breast. Both contrast-enhanced lesion morphology and temporal pattern of contrast enhancement are useful in the detection and characterization of breast cancer. DCE MRI is typically performed with a 3D gradient-recalled echo (GRE) sequence, with the shortest repetition time (TR) allowed by the gradient capabilities. Faster and stronger gradients allow shorter TR's, leading to reduced susceptibility artifacts and faster imaging. Faster imaging allows higher spatial resolution for better lesion morphology assessment and higher temporal resolution for better characterization of lesion enhancement.

SUMMARY OF THE INVENTIONS

Therefore, there is a need for improving gradient performance in MRI.

A composite gradient system is described, including a body gradient system and an insert gradient system, in which the body gradient system and the insert gradient system can be driven independently and simultaneously. The composite gradient system can provide an operator with the flexibility of imaging a subject using the body gradient system alone, the insert gradient system alone, or both gradient systems simultaneously, and therefore enjoy the advantages of each gradient system. In some embodiments, the body gradient system and the insert gradient system may be driven concurrently during an imaging sequence to produce composite magnetic field gradients having high amplitude and/or fast slew rate, resulting in high image resolution and/or fast image acquisition. In some embodiments, a subject may be imaged using the body gradient system alone while leaving the insert gradient system in place.

Some embodiments include a method of magnetic resonance imaging comprising: positioning an insert gradient system within a bore of a magnetic resonance imaging (MRI) system, the MRI system comprising a body gradient system; placing a subject to be imaged within the insert gradient system; transmitting a radio frequency (RF) pulse sequence into the subject; driving the insert gradient system and the body gradient system concurrently with currents to produce a composite magnetic field gradient within the subject; after the driving, receiving signals emitted from the subject; and processing the received signals into an MRI image of the subject.

In some embodiments, the driving the insert gradient system and the body gradient system further comprises: driving the body gradient system with a current to produce a body magnetic field gradient within the subject; and driving the insert gradient system with a current to produce an insert magnetic field gradient within the subject having approximately the same waveform shapes and timing as has the body magnetic field gradient; wherein the composite magnetic field gradient is a combination of the body magnetic field gradient and the insert magnetic field gradient.

In some embodiments, the composite gradient has an amplitude of at least twice an amplitude of the body gradient. In some embodiments, the composite magnetic field gradient is a combination of the body magnetic field gradient and the insert magnetic field gradient over the same space within the insert gradient system. In some embodiments, the RF pulse sequence and composite magnetic field gradient are based on an imaging sequence comprising at least one of an echoplanar imaging sequence, a turbo spin echo imaging sequence, and a stead state free precession imaging sequence.

Some embodiments further comprise, while the insert gradient system is positioned within the bore of the MRI system, driving the body gradient system with the insert gradient system substantially turned off to obtain another MRI image of the subject.

Some embodiments further comprise driving the insert gradient system with the body gradient system substantially turned off to obtain another MRI image of the subject.

In some embodiments, the positioning the insert gradient system within the bore of the MRI system comprises placing the insert gradient system on a table configured to slide within the bore of the MRI system.

Some embodiments include a method of magnetic resonance imaging comprising: positioning an insert gradient system within a bore of a magnetic resonance imaging (MRI) system, the MRI system comprising a body gradient system;

placing a subject to be imaged within the insert gradient system; driving the insert gradient system to obtain a first MRI image of the subject; and while the insert gradient system is positioned within the bore, driving the body gradient system within the insert gradient system substantially turned off to obtain a second MRI image of the subject.

In some embodiments, the insert gradient system is driven with a current to produce a magnetic field gradient having a higher amplitude than a magnetic field gradient of the body gradient system. Some embodiments further comprise driving the body gradient system concurrently with insert gradient system to obtain the first MRI image.

In some embodiments, the positioning the insert gradient system within the bore of the MRI system comprises placing the insert gradient system on a table configured to slide within the bore of the MRI system.

Some embodiments include a magnetic resonance imaging (MRI) system, comprising: a body gradient system; a bore; an insert gradient system positioned within the bore and configured to permit a subject to fit within the insert gradient system; a transmitter that transmits a radio frequency (RF) pulse sequence into the subject; wherein the insert gradient system and the body gradient system are configured to be driven concurrently with currents to produce a composite magnetic field gradient in the subject; wherein the MRI system is configured to (a) receive RF signals emitted from the subject after the composite field gradient is produced in the subject, and (b) process the received signals into an MRI image of the subject.

It is to be understood that both the foregoing general description and the following detailed description are exemplary and explanatory and are intended to provide further explanation of the inventions as claimed.

DETAILED DESCRIPTION OF THE INVENTION

Insertable, reduced-volume gradient coils can provide substantial improvement in gradient speed and amplitude. Because conventional MRI systems have only one set of gradient amplifiers, connecting insert gradient coils requires disconnection of the body gradient coils. Thus, to use insert gradient coils for one pulse sequence on a patient usually requires that the insert gradient coils be used for all pulse sequences of the exam. Further, when the body gradient coils are disconnected, the linear first order gradient shimming that is normally performed with static currents applied to the three axes of the body gradients must be performed using the insert gradients which are typically less homogeneous than the body gradients. It is possible that only part of a single pulse sequence may require high gradient performance and that part may allow reduced homogeneity or reduced volume or both. As a simple example, slice selection that is performed using the insert gradients will be less uniform than that performed with the more uniform whole-body gradients. The shape of the excited slice can be distorted more like a potato chip than the flat plane that may be desired, and correction for that shape is difficult at best.

To overcome these problems, local and whole-body gradients may be combined in such a manner as to exhibit the best advantages of both types of gradients. The local gradients can be used to achieve high amplitudes and fast slew rates within the limits of nerve stimulation. The local gradients may be used to provide diffusion encoding, flow encoding, and gradient spoiling pulses while imaging is performed with the more homogeneous body gradients.

Because local gradients generally show a decrease in gradient uniformity over the imaging volume, the inclusion of some fraction of the body gradients with the local gradients can add an improved homogeneous component to the net gradients. Combining the body gradients with the small local gradients also increases gradient strength over that of the local gradients alone.

Figure 1A:
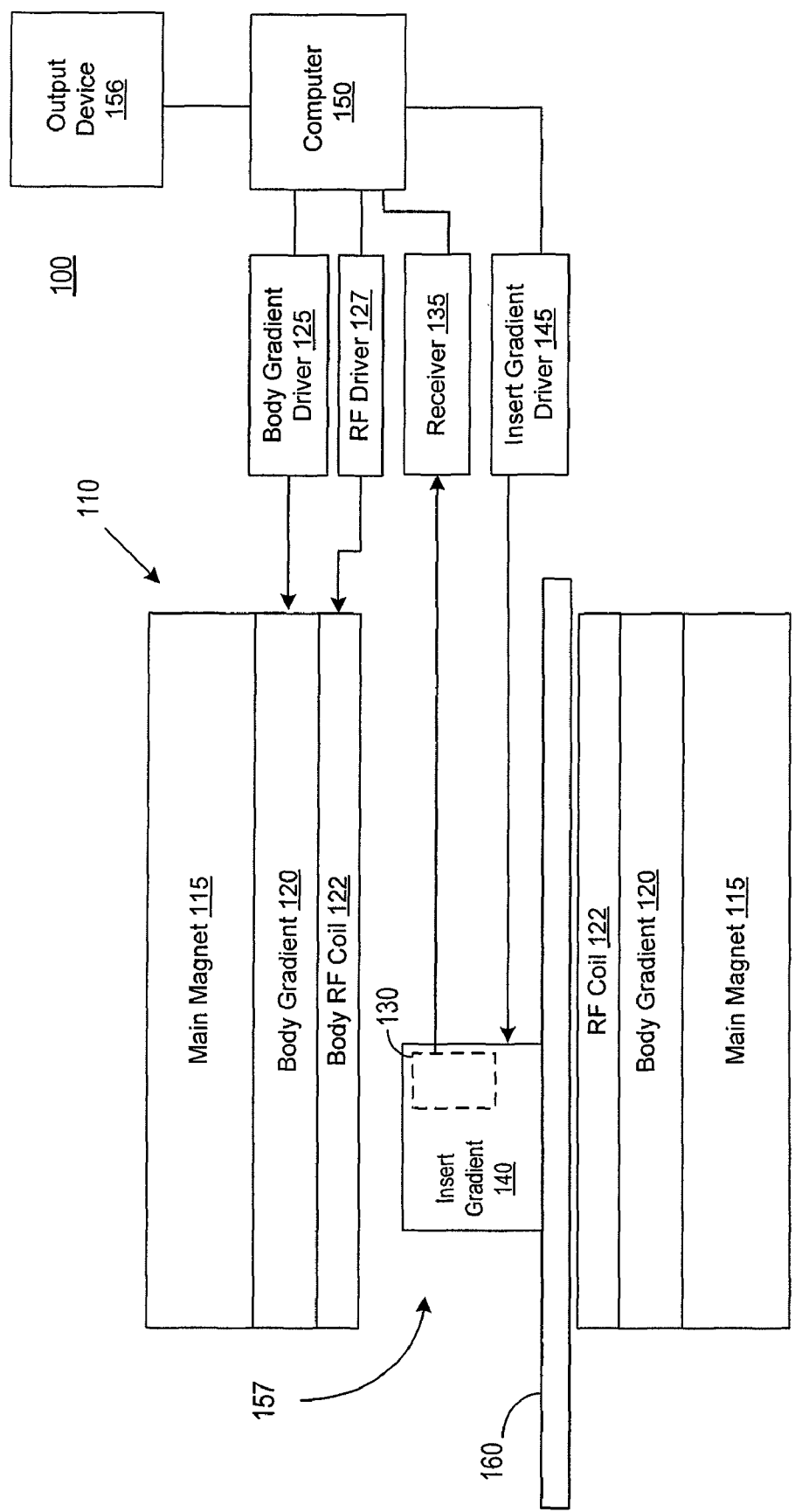
FIG. 1(a) illustrates a composite gradient system according to an embodiment of the present invention.

FIG. 1(a) shows a block diagram of a composite gradient system 100 according to embodiment of the present invention. The composite system 100 comprises a body MRI system 110, an insert gradient system 140, and a receive RF coil 130. The composite gradient system 110 further comprises a body gradient driver 125, an RF driver 127, a receiver 135, an insert gradient driver 145, and a computer 150.

The MRI system 110 may be implemented using a Siemens TIM trio 3 Tesla MRI scanner or other commercially available MRI system. The MRI system 110 may comprise a main magnet 115, a body gradient system 120, a body RF coil 122, and a central bore 157 running through the MRI system 110 and adapted to receive the subject being imaged. The MRI system 110 may further comprise a slideable table 160 configured to position a subject on the table 160 in the bore 157 of the MRI system 110.

The main magnetic 115 may be configured to produce a main magnetic field $B_o$ along the z axis of the MRI system 110. The body gradient system 120 may comprise body gradient coils configured to produce body gradients within the bore 157 along the x, y and z axes. The body RF coil 122 may be configured to transmit RF signals (e.g., RF pulses) into the subject in the bore 157. The body gradient system 120 may be driven by the body gradient driver 125, which may comprise a set of gradient amplifiers configured to output currents for driving the gradient coils of the body gradient system 120. The body RF coil 122 may be driven with an RF pulse sequence by the RF driver 127.

The insert gradient system 140 may be placed within the bore 157 of the MRI system 110 and may comprise gradient coils configured to produce insert gradients along the x, y and z axes. In one embodiment, the insert gradient system 140 can be operated simultaneously with the body gradient system 120 of the MRI system 110 to produce composite gradients, as discussed further below. The insert gradient system 140 may be dimensioned to fit around a subject being imaged. The insert gradient system 140 may be driven independent of the body gradient system 120 by the insert gradient driver 140, which may comprise a set of gradient amplifiers configured to output currents for driving the gradient coils of the insert gradient system 140. Different insert gradient systems may be used to image different portions of a patient. For example, an insert head gradient system configured to fit around a patient's head may be used to image a patient's head. For other examples, the insert gradient system may be configured to fit around a patient's wrist, breast, knee or other portion of the patient to specifically image that portion of the patient.

In one embodiment, the receive coil 130 may be positioned within a bore of the insert gradient system 140. The receive coil 130 may comprise one or more coils adapted to fit on the subject being imaged and configured to detect NMR signals emitted from the subject during an imaging sequence, as discussed further below.

The composite gradient system 100 may produce MRI images using various imaging sequences, including an echoplanar imaging (EPI) sequence, a steady state free precession (SSFP) sequence, a turbo spin echo (TSE) sequence, and other imaging sequences known in the art. For a particular imaging sequence, the computer 150 may drive the body RF coil 122 with an RF pulse sequence via the RF driver 127 in accordance with the imaging sequence. The computer 150 may also drive the body gradient system 120 and/or the insert gradient system 140 with gradient pulse sequences in accordance with the imaging sequence. During the imaging sequence, the receive coil 130 may detect NMR signals emitted from the subject as a result of the RF and gradient sequences. The detected NMR signals may be amplified by the receiver 135 and processed into an MRI image by the computer 150. The MRI image may be outputted on an output device 156 (e.g., display, printer, etc.) to an operator. The output device 156 may also transmit the MRI image over a network to another computer and/or data base.

Instead of transmitting the RF signals into the subject from the body RF coil 122, the computer 150 may drive a local transmit RF coil (not shown) located within the bore 157 of the MRI system 110 with an RF pulse sequence via the RF driver 127 or another RF driver.

In one embodiment, the computer 150 may simultaneously drive the body gradient system 120 and the insert gradient system 140 via the body gradient driver 125 and the insert gradient driver 145, respectively, to produce composite magnetic field gradients. For example, the computer 150 may drive the body gradient system 120 and the insert gradient system 140 simultaneously such that the gradient waveforms for both gradient systems have approximately the same shapes and timing to produce composite gradients. The composite gradients may have higher amplitudes and faster slew rates than can be achieved by either gradient system alone. The higher amplitude is achieved by combining the strengths of the body gradients and the insert gradients. Further, the composite gradients are able to reach the higher amplitude in the same amount of time it takes the body gradients and the insert gradients to reach their respective amplitudes, resulting in faster slew rates for the composite gradients.

The high amplitude and fast slew rate of the composite gradients enable the composite gradient system 110 to achieve higher resolution and faster image acquisition, which is advantageous for various types of MRI. The composite gradients may also exhibit improved gradient uniformity compared with insert gradients alone by the inclusion of the body gradients, which are generally more uniform.

Figure 2:
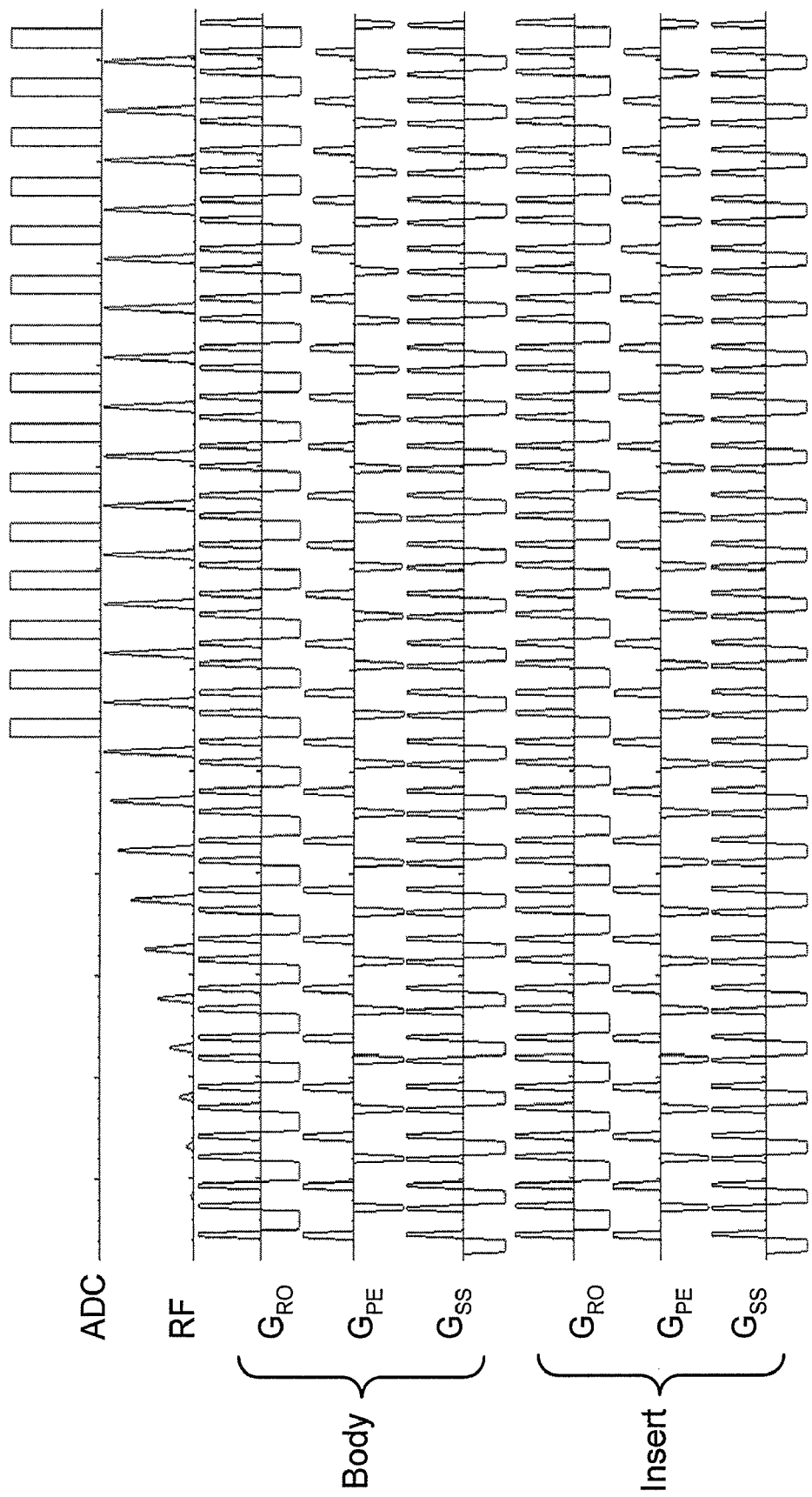
FIG. 2 shows a pulse sequence diagram according to an embodiment of the present invention.

FIG. 2 shows an example of a pulse sequence diagram for a 2D SSFP sequence, in which the body gradient system 120 and the insert gradient system 140 are driven simultaneously such that the gradient waveforms for both gradient systems have approximately the same shapes and timing. FIG. 2 shows an analog to digital conversion (ADC) signal, which is high when data is being acquired and low when no signal is being acquired. FIG. 2 also shows an RF pulse sequence for the transmit RF coil (e.g., RF body coil 122 or local transmit RF coil). FIG. 2 also shows three gradient pulse sequences for each of the two gradient systems including the readout gradient $G_{RO}$, the phase encoding gradient $G_{PE}$, and the slice select gradient $G_{SS}$. The readout gradient $G_{RO}$ is active during signal readout (e.g., when ADC signal is high), the slice select gradient $G_{SS}$ is active during the RF pulse. There may be pulses on the phase encoding, readout, and slice select gradients during times when the ADC and the RF waveforms are off. In this embodiment, the gradient pulse sequences for the body gradient system 120 and the insert gradient system 140 have approximately the same waveform shapes and timing to produce composite magnetic field gradients. Although the gradient pulse sequences for the two gradient systems have approximately the same waveform shapes and timing, they do not necessary have the same amplitude. For example, the insert gradient system 140 may contribute more gradient strength to the composite gradients than the body gradient system 120.

In one embodiment, the computer 150 may drive the body gradient system 120 and the insert gradient system 140 simultaneously in such a manner that the gradient systems have different shapes instead of the same shapes to produce the composite magnetic field gradients. In an embodiment, a gradient sequence for an imaging sequence may include one or more composite gradient pulses generated from both gradient systems and gradient pulses generated from only one of the gradient systems. The composite gradient pulses and gradient pulses generated from only one of the gradient systems may occur at different times during the gradient pulse sequence and/or along different axes. For example, during an imaging sequence, both gradient systems may be driven simultaneously to produce a composite readout, phase encoding gradient and/or slice select magnetic field gradient while only one of the gradient systems is driven to produce another readout, phase encoding gradient and/or slice select magnetic field gradient.

In one embodiment, the computer 150 may use the body gradient system 120 in an imaging sequence with the insert gradient system 140 turned off to obtain an MRI image and use the insert gradient system 140 in another or the same imaging sequence with the body gradient system 120 turned off to obtain another MRI image. In this embodiment, the insert gradient system 140 may be placed within the bore 157 and left within the bore 157 while the computer 150 acquires an MRI image using only the body gradients. An advantage of this embodiment is that the insert gradient system 140 does not have to be removed from the bore 157 of the MRI system 110 each time an MRI image is obtained using the body gradient system 120. In this embodiment, the computer 150 may selectively operate the body gradient system 120 and the insert gradient system 140 separately to obtain different MRI images of the same subject during an exam. The computer 150 may also operate both gradient systems simultaneously to obtain an MRI image using composite gradients, as discussed above. Thus, the composite gradient system 100 provides the operator with the flexibility of selecting the body gradient system 120 and the insert gradient system 140 independently and simultaneously during an exam without having to disconnect and reconnect either gradient system.

Figure 1B:
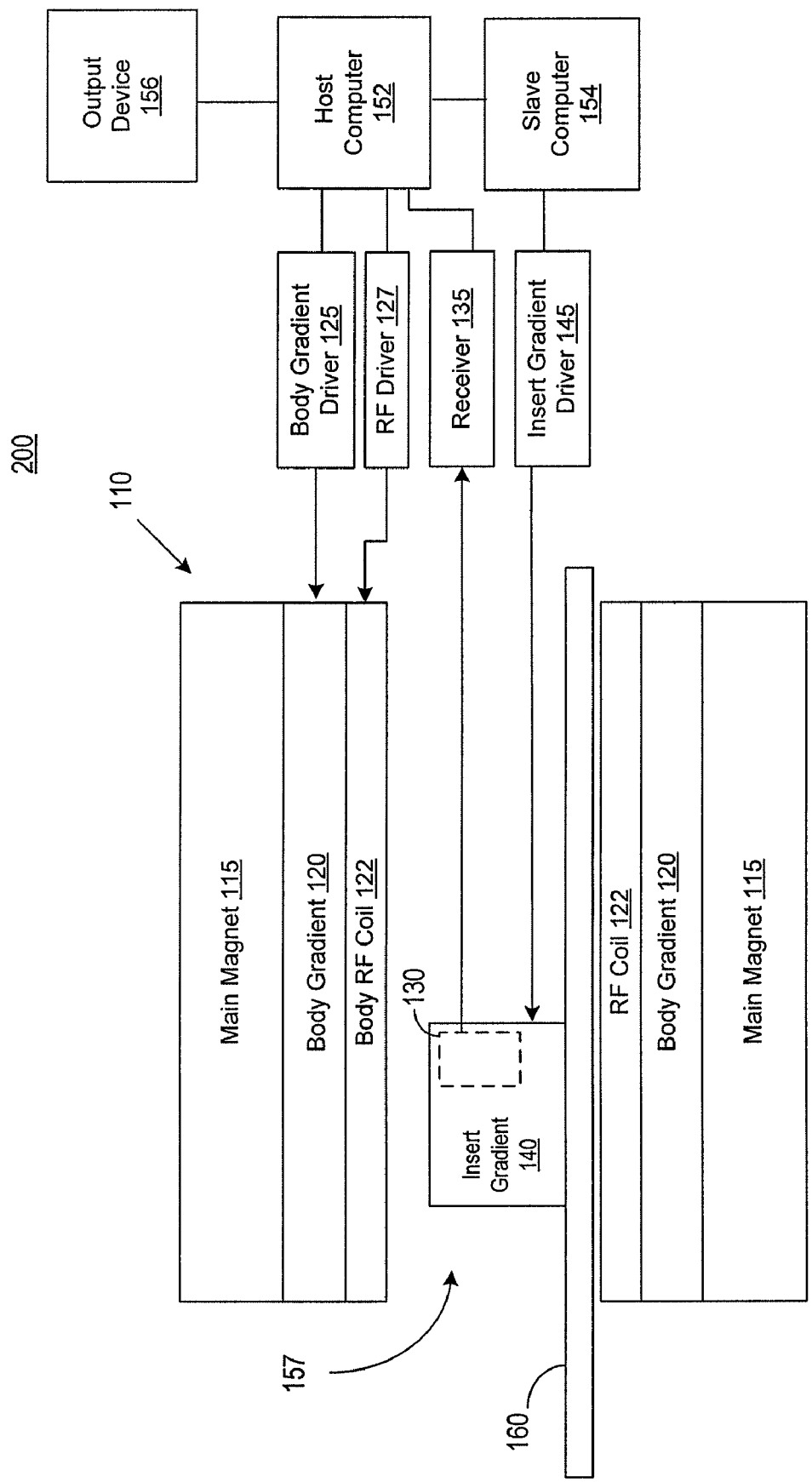
FIG. 1(b) illustrates a composite gradient system having a host/slave configuration according to an embodiment of the present invention.

FIG. 1(b) shows the composite gradient system 110 according to an embodiment of the present invention, in which the computer 150 comprises a host computer 152 for operating the MRI system 110 and a slave computer 154 for operating the insert gradient system 140. In this embodiment, the host computer 152 may control operations of the MRI system 110 to obtain an MRI image in accordance with an imaging sequence including exciting a transmit RF coil (e.g., body RF coil 122 or local transmit RF coil) with an RF pulse sequence, driving the body gradient system 120 with a gradient pulse sequence, acquiring and processing signals from the receive coil 130 into the MRI image, and maintaining first order shims.

The slave computer 154 may be configured to drive the insert gradient system 140 via the insert gradient driver 145 with a gradient pulse. In one embodiment, the host computer 152 may transmit a trigger signal to the slave computer 154 at the start of an imaging sequence. Upon receiving the trigger signal, the slave computer 154 may drive the insert body gradient 140 with its gradient pulse sequence. Thus, the slave computer 154 may use the trigger signal from the host computer to synchronize the gradient pulse sequence of the insert gradient system 140 with the gradient pulse sequence of the body gradient system 120 to produce composite gradients, as discussed above. In one embodiment, the host and slave computers 152 and 154 may simultaneously operate their respective gradient systems such that the gradients of the gradient systems have approximately the same waveform shape and timing to produce the composite gradients.

Each of the computers 152 and 154 may comprise one or more processors for performing the functions described in the disclosure. A processor may comprise a general purpose processor, a digital signal processors (DSPs), application specific integrated circuit (ASICs), discrete hardware components, or any combination thereof. Each computer may also comprise computer-readable media for storing software instructions executed by the processor and pulse sequences. For example, the computer-readable media of each computer may store one or more gradients pulse sequence for driving the respective gradient system. The computer-readable media may include volatile memory, nonvolatile memory, a Random Access Memory (RAM), a flash memory, a Read Only Memory (ROM), a removable disk, a CD-ROM, a DVD, any other suitable storage device, or a combination thereof.

In certain embodiments, the composite gradient system 110 is operated in such a manner that the gradient waveform shapes and timing are identical for both gradient systems. Improvements that can be achieved from simultaneous dual gradients for EPI, SSFP, and TSE sequences are provided.

Echoplanar Imaging

Echoplanar imaging (EPI), in which the entire signal for an image is acquired after a single excitation, is very sensitive to the total readout duration, $T_{total}$. Any distortion, $\Delta B_o$, in the main magnetic field (e.g., susceptibility variations) will result in a shift of image voxels: $\Delta y = \Delta B_o/BW$. The bandwidth (BW) for the phase encoding direction is $1/T_{total}$ where $T_{total}$ can be quite long (around 100 ms or more) for EPI. $T_{total}$ is a function of many factors, including the desired resolution and gradient performance factors, and may be given by:

$$T_{total} = N_y[2T_{rise} + T_{DAQ}] = N_y\left[2\frac{G}{R_s} + \frac{1}{\gamma_g G \Delta x}\right] \quad (1)$$

where $T_{rise}$ is the rise time for each ramp, $T_{DAQ}$ is the time to acquire the data from a single echo in the echotrain, G is the amplitude of the readout gradient, $R_s$ is the maximum allowed slew rate, $\gamma_f$ is the gyromagnetic ratio in Hz/T and $\Delta x$ is the resolution. To minimize distortion, G is selected to minimize $T_{total}$ according to the following equation:

$$\frac{\partial T_{total}}{\partial G} = N_y\left[\frac{2}{R_s} - \frac{1}{\gamma_f G^2 \Delta x}\right] = 0 \text{ or } G^2 = \frac{R_s}{2\gamma_f \Delta x}. \quad (2)$$

Figure 3:
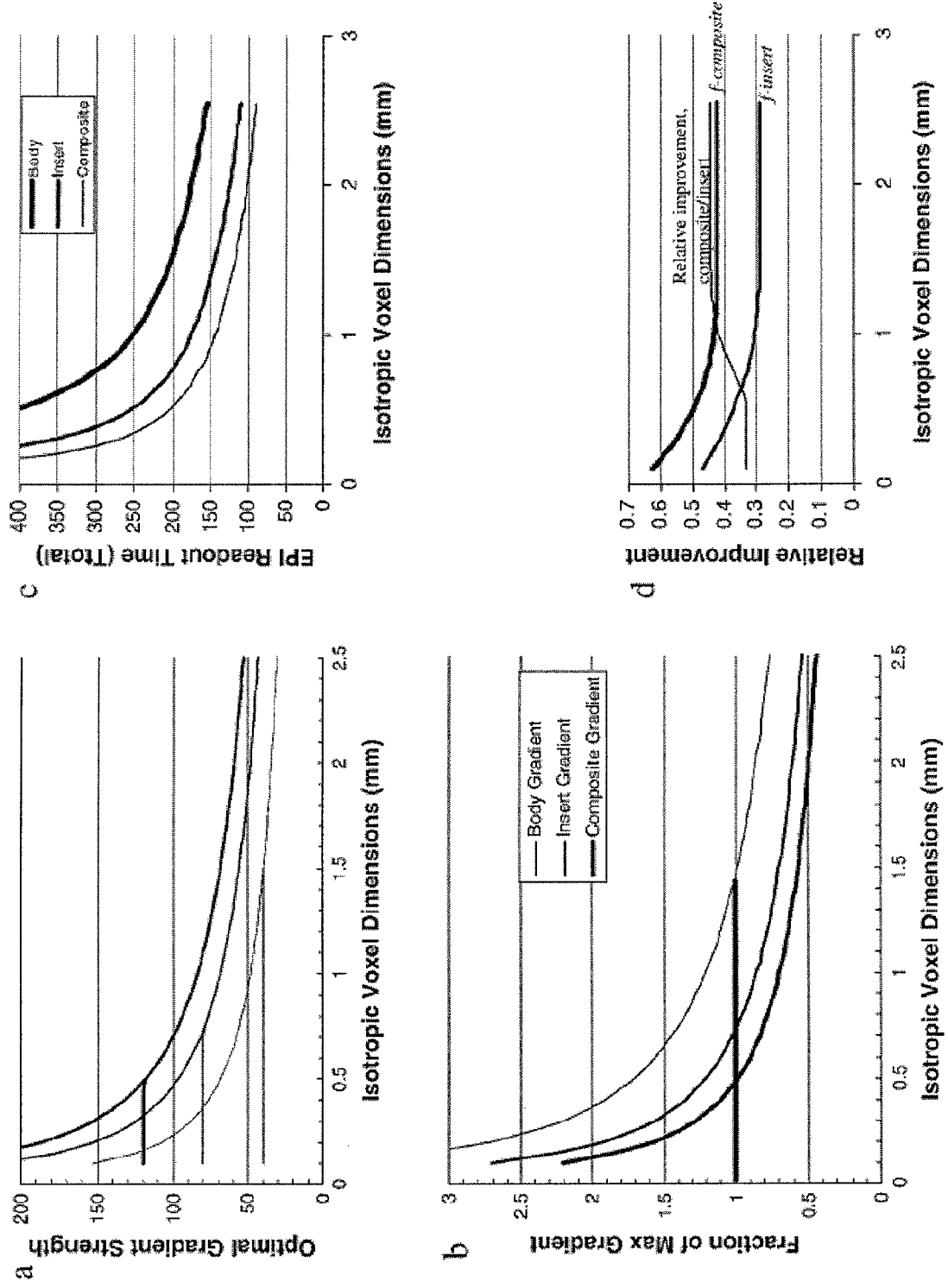
FIG. 3(a) is a plot showing optimal gradient strength for body, insert and composite gradients as a function of resolution.
FIG. 3(b) is a plot showing the ratio of optimal gradient to the maximum gradient for body, insert and composite gradients.
FIG. 3(c) shows total acquisition time as a function of resolution for body, insert and composite gradients.
FIG. 3(d) shows fractional improvements using insert and composite gradients.

Thus for any given gradient slew rate, the best (desired) gradient is only a function of resolution (until G reaches and remains at the maximum gradient for the system, $G_{max}$). In FIG. 3(a), the optimal gradient strength is plotted for a typical high performance body gradient ($G_{max}$=40 mT/m and $R_s$=200 T/m/s), an insert gradient ($G_{max}$=80 mT/m and $R_s$=400 T/m/s), and a composite gradient ($G_{max}$=120 mT/m and $R_s$=600 T/m/s) as a functions of resolution. The horizontal lines in FIG. 3(a) indicate where the optimal gradient strength is at the maximum available for the given gradient system. FIG. 3(b) shows the ratio of the optimal gradient to the maximum gradient for each system. The thick horizontal line in FIG. 3(b) indicates where the optimal gradient strength is at the maximum available for the given gradient system. At higher resolution (smaller voxels) the optimal gradient strength cannot be attained. The insert gradient performance values are those of a commercially available head insert gradient system. The limits are conservative and are actually set by concerns over audible gradient sound levels rather than heat dissipation limits. Sound levels can be reduced by improved design. The total acquisition time, $T_{total}$, obtained using the optimal gradient strength (limited by the maximum allowed gradient for each system) is plotted in FIG. 3(c) for each gradient system. For comparison, the fractional improvement (fractional reduction in total readout time) for the insert gradient is defined as $f_{insert}$=1.0−$T_{total}$(insert)/$T_{total}$(body).

Similarly, the fractional improvement for the composite gradient is defined as $f_{composite}=1.0-T_{total}(composite)/T_{total}(body)$. The fractional improvements are plotted in FIG. 3(a) as a function of resolution. As shown in FIG. 3(d), for nearly all resolutions (for voxels>1 mm), the insert and composite gradients yield fractional reductions in $T_{total}$ of 30% and 44%, respectively. The thin line is the fraction of total time reduction $(T_{total}(body)-T_{total}(composite))$ that comes from combining the body gradients with the insert gradients: $(T_{total}(insert)-T_{total}(composite))/(T_{total}(body)-T_{total}(composite))$. The flat segment for $\Delta x<0.5$ is due to the fact that the maximum gradient strength is attained for each system.

Steady State Free Precession

Figure 4:
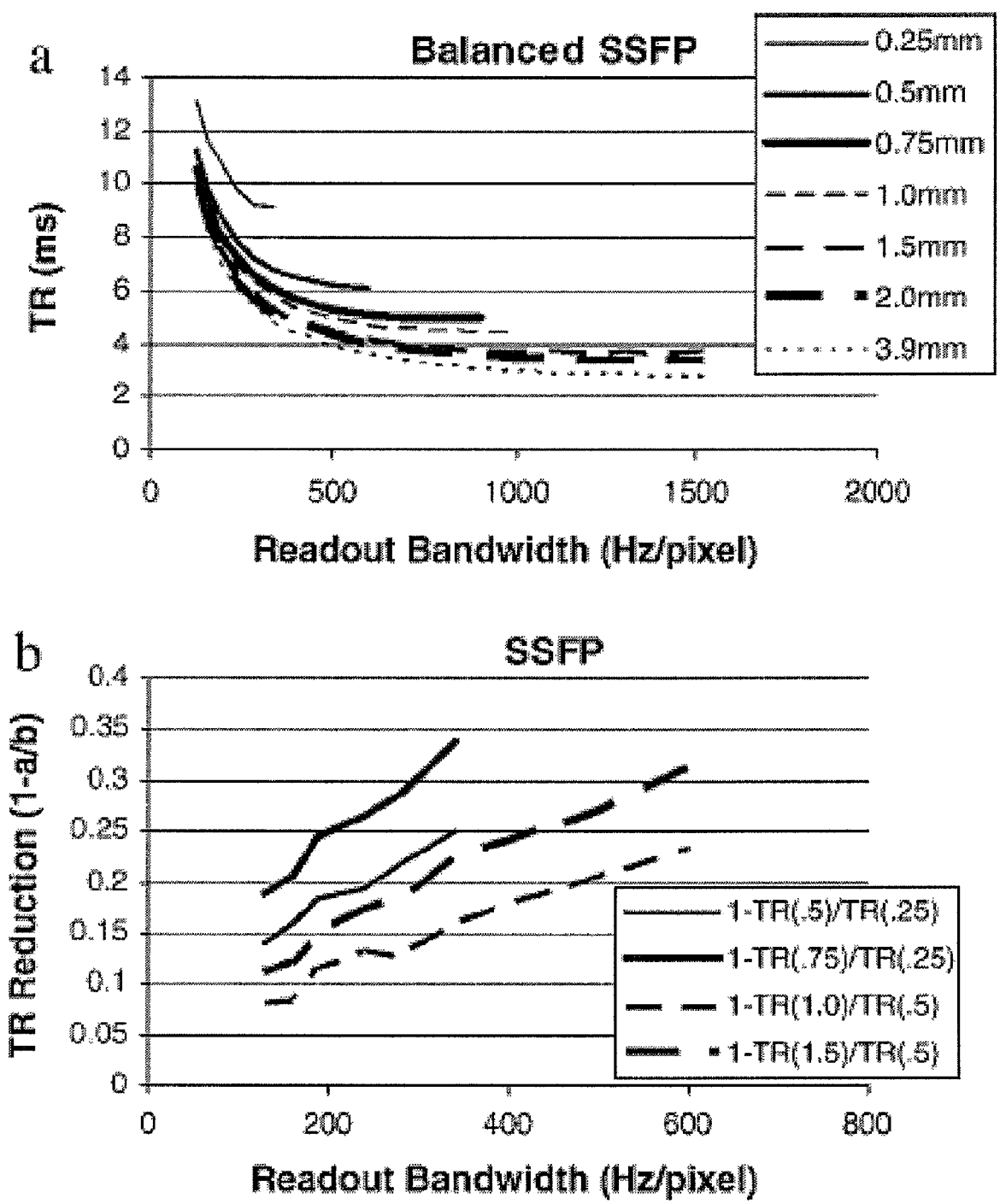
FIG. 4(a) is a plot of TR for balanced SSFP as a function of read bandwidth for several isotropic voxel resolutions.
FIG. 4(b) is a plot of fractional reduction in TR for insert and composite gradients.

Improved gradient performance can allow shorter repetition times (TRs) for steady state free precession (SSFP) sequences such as "True FISP" or "FIESTA" where the frequency bandwidth that can be imaged without artifact is 1/TR. If magnetic field inhomogeneity causes a larger frequency variation in the imaging volume than 1/TR, dark banding is observed. To calculate the TR as a function of increased gradient strength, we consider the TR reduction that would occur if we simply used larger voxels. If the insert gradient amplitude and slew rate are a factor of 2 greater than the body gradient, then the composite gradients can achieve a factor of 3 increase in resolution with no change in the timing of the imaging gradient pulses. This is illustrated FIG. 4(a), which plots TR for balanced SSFP as a function of readout bandwidth for several isotropic voxel resolutions (0.25, 0.5, 0.75, 1.0, 1.5, 2.0, 3.9 mm) on a Siemens TIM Trio 3T MRI scanner. For any line plotted, it is assumed that the insert gradient can achieve double the resolution while the composite gradients can achieve triple the resolution. Thus, the insert gradients with the TR for 0.5 mm resolution would achieve 0.25 mm isotropic resolution. Similarly, the composite gradients with the TR for 0.75 mm resolution would achieve the 0.25 mm resolution. FIG. 4(b) plots the fractional reduction in TR for the insert and composite gradients, respectively: $f_{insert}=1.0-TR_{insert}/TR_{body}$ and $f_{composite}=1.0-TR_{composite}/TR_{body}$. FIG. 3(b) shows the relative improvements for insert (thin line) and composite gradients (thick line) for 0.25 mm (solid) and 0.5 (dashed) isotropic resolution, respectively. Note that because the interdependence of the various gradient pulses makes it difficult to predict minimum TR, we prescribed the sequence on the Siemens TIM Trio and have used the solver on the MRI scanner to determine the minimum TR. This method results in the "bumpiness" of the lines plotted.

Turbo Spin Echo

Figure 5:
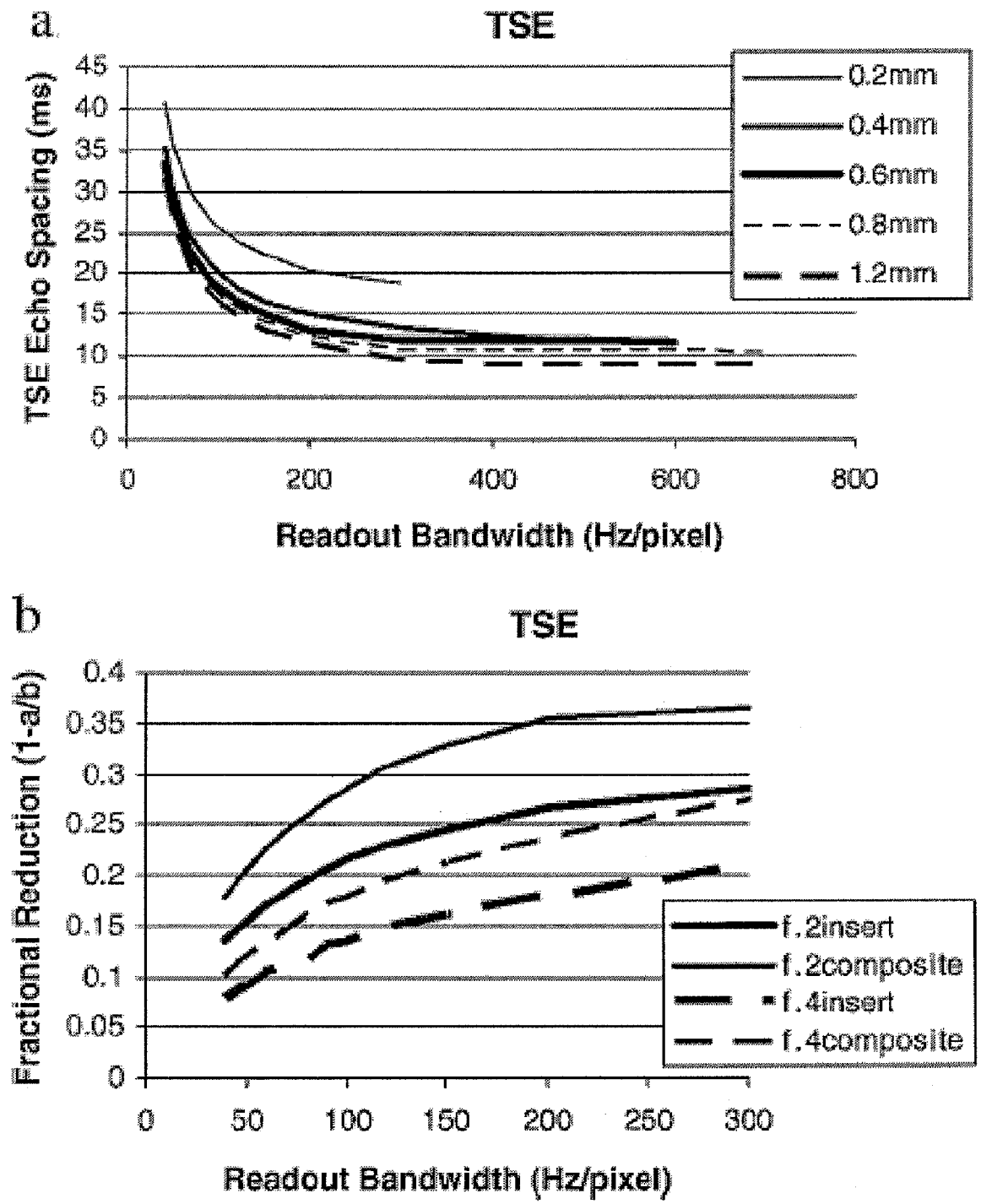
FIG. 5(a) shows ESP for TSE versus bandwidth and resolution.
FIG. 5(b) is a plot of fractional reduction in ESP for insert and composite gradients.

Calculating the echo-spacing (ESP) in a turbo spin echo (TSE) sequence is more involved because the ESP also includes non-imaging (crusher and spoiler) gradient pulses that may not change with resolution as well as the slice selective refocusing pulses that depend upon the desired slab thickness and RF bandwidth. To estimate the reduction in ESP that may be obtained, we prescribe a 3D TSE sequence with isotropic voxels of 0.2, 0.4, 0.6, 0.8, and 1.2 $mm^3$, using a range of readout bandwidths from 40 to 300 Hz/pixel (see FIG. 5(a)). FIG. 5(a) shows the ESP for TSE versus bandwidth and resolution. At a bandwidth of 200 Hz/pixel, ESP for 0.2 mm isotropic voxels is reduced from 20.6 to 15.1 and 13.3 mm for the insert and composite gradients, respectively. Again, in this case, the body gradient ESP for 0.4 mm isotropic resolution would be the same ESP as for the insert gradients (with twice the performance as the body gradients) at 0.2 mm isotropic resolution. The composite gradients with triple the performance achieves 0.2 mm isotropic resolution with an ESP equivalent to the body gradients at 0.6 mm isotropic resolution. Similarly, insert and composite gradients with ESPs corresponding to the body gradients at 0.8 and 1.2 mm isotropic resolution, respectively, attain 0.4 mm isotropic resolution. FIG. 5(b) plots the fractional reduction in ESP $(f=1.0-ESP_{insert}/ESP_{body})$ for insert (thick line) and composite gradients (thin line) for 0.2 mm (solid) and 0.4 mm (dashed) resolution. The expected reduction is most evident for high resolution where the imaging gradients have a greater amplitude (area) relative to the spoiler and crusher gradients. Using composite gradients (ESP of body gradients at 0.6 mm isotropic voxels) yields a 35% reduction in ESP over that of the body gradients for 0.2 mm isotropic voxels. TSE images (especially T1 and PD images) can be highly blurred for long echo trains. Thus, a 35% reduction in the ESP should result in a substantial decrease in blurring as well as allow the interleaving of more slices. The shorter ESP can also be used to shorten the total acquisition time (by putting more echoes into the echotrain in order to keep the total time for each echotrain constant). The reduction for lower resolution is less in this plot because the system is not reducing the crusher and spoiler gradients. For composite gradients, the duration of these non-imaging gradients would likely be reduced, so the ESP reductions would be comparable (greater than 35%) at all resolutions.

Experimental results using a composite gradient system according to an embodiment of the present invention are described below.

Experiments were performed on a Siemens TIM Trio 3 Tesla MRI scanner (Siemens Healthcare AG, Erlangen, Germany) that has been modified, using hardware and software provided by Siemens, to simultaneously control the body gradient system and an insert gradient system. The body gradient system is controlled using the standard Siemens host computer (master-host), gradient control lines, and gradient amplifiers. The insert gradient system is controlled by a separate slave-host computer, control lines and an additional set of gradient amplifiers. To allow complete generality, independent pulse sequences are executed on the master and slave computer systems. Pulse sequences can then be designed that independently control each individual gradient waveform on each gradient system. During scanning, the master and slave computers are synchronized to provide synchronized gradient operation.

For simplicity in the experiments, the pulse sequences for each gradient system is set to have identical gradient waveform shapes and timing, with the insert waveform amplitude controlled by the modifications to the gradient sensitivity tables. For these experiments, transmit RF, receive RF, and data acquisition are controlled by the master-host computer, and reconstruction is performed using a standard reconstruction system. The master-host system also maintains the first and second order gradient shims on the standard body gradients.

In these experiments, a head insert gradient system was positioned within the bore of the 3T MRI scanner and attached to the slave gradient system while the whole-body gradients remained attached to the host system. The insert gradient system was designed and developed by Blaine Chronik, at the University of Western Ontario, in London, Ontario. This insert gradient system was designed with an efficiency goal of 0.4 mT/m/A and an inductance goal of less than 1000 uH. The inner coil diameter was 32 cm, and the outer diameter was 42 cm. The coil was unshielded because of the relatively small diameter. The measured X, Y, and Z gradient parameters were: efficiency=0.4, 0.35, 0.35 mT/m/A, inductance=770, 810, 860 uH, and resistance=220, 235, and 153 mOhms, respectively (at 10 kHz). With a current of 200 A, these efficiencies result in gradients of 84, 70, and 70 mT/m, which are substantially stronger than the technical limits of 40 mT/m on most high performance whole-body gradient systems. This insert gradient system has been successfully used at field strengths between 0.5 and 4.0 T.

The insert gradient system was designed with the homogeneous region at the end of the gradient insert and extending a few centimeters outside of the insert gradient bore to allow high resolution imaging of the head and neck. A Siemens circularly polarized transmit/receive (Tx/Rx) wrist coil (model #1P8622701) was used for the images displayed in this disclosure and identical waveforms were used on both gradient systems, yielding a doubling of gradient strength over that obtained with the whole-body gradients alone when the gradient systems were used simultaneously.

A lemon was used as the imaged phantom since it was small enough to fit in the wrist Tx/Rx coil and provided fine internal detail necessary for qualitative assessment. All images displayed were acquired with a basic FLASH sequence. EPI, TSE, and SSFP sequences may also be used with the composite gradient system. Acquisition parameters were as follows: repetition time (TR) 300 ms, echo time (TE) 6 ms, bandwidth (BW) 200 Hz/pixel, slice thickness 5 mm, image matrix 256×256 pixels, and a field of view (FOV) 200 mm except when the gradients were operated together resulting in a FOV of 100 mm.

Images of the lemon were obtained using each gradient system separately and then in combination. The head insert gradient system was positioned on a table within the bore of the Siemens Trio 3T MRI scanner. The lemon was scanned with a 200 cm FOV using the FLASH sequence with the parameters given above. Example images are shown in FIG. 6 displaying the acquisition of axial lemon images using different combinations of the gradient insert and standard imaging gradients.

Figure 6:
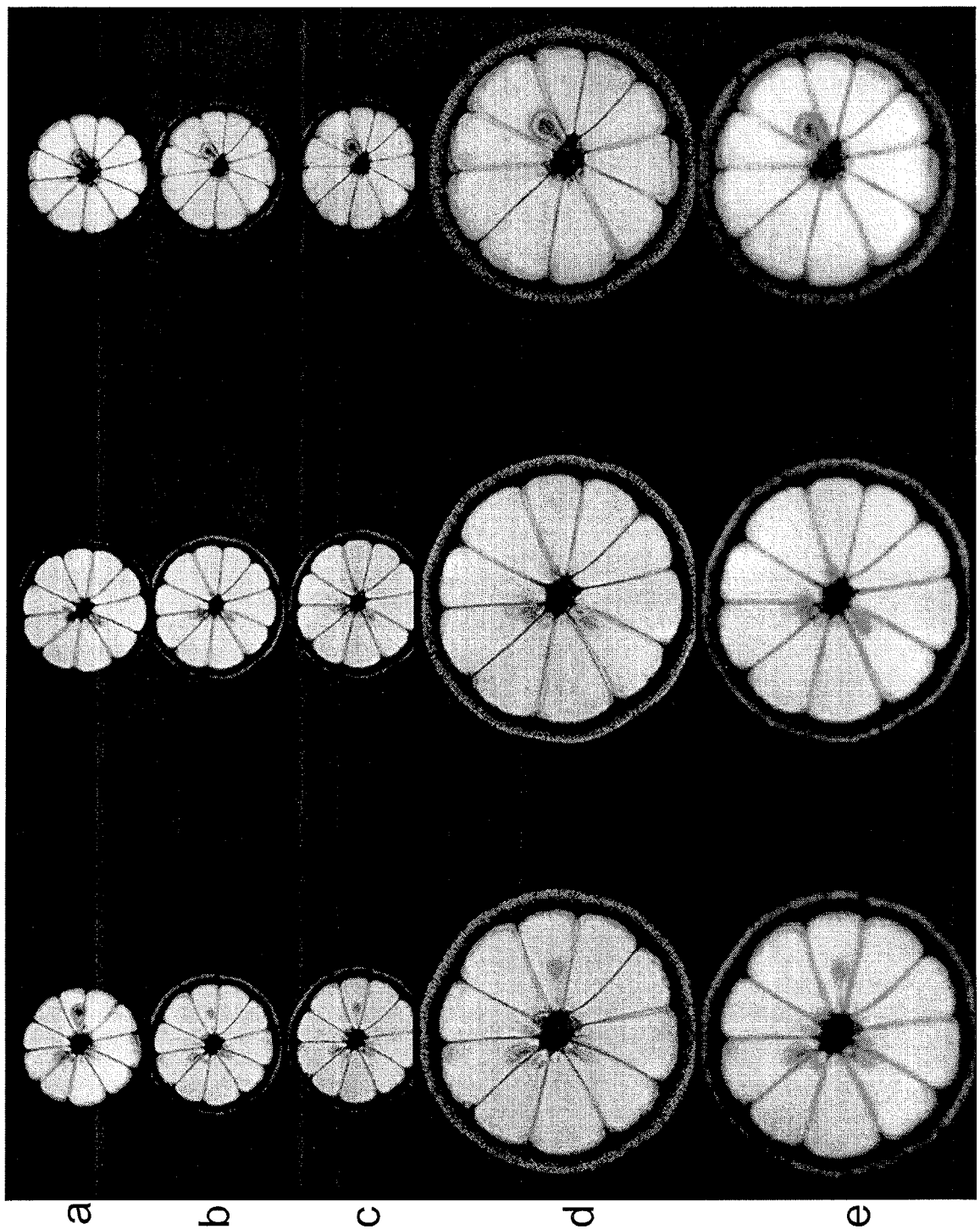
FIG. 6 shows MRI images obtained using body gradients, insert gradients and composite gradients.

FIG. 6 shows images of three non-adjacent axial slice locations of a lemon (a, b) using the body gradients without (a) and with (b) the head insert gradient system in place, (c) using the insert gradients, and (d) using composite head and body gradients. There is a slight repositioning error between (a) and (b) because the lemon had to be repositioned after the gradient insert system was placed on the table. For simplicity, the same FOV was used for the body and head insert gradients such that the combined gradient image had the FOV cut by 50% in both x and y directions. Only the body gradients were used for slice selection. To compare the different resolutions obtained between the insert and the composite gradient (e), the images of (c) are scaled by a factor of 2 in x and y.

In this experiment, and in upwards of 15 experiments performed after, no differences were found between images obtained using the body gradients with and without the insert gradient system in place. We were able to image with the body gradients alone (with and without the head insert gradients in place), with the head insert gradients alone, and with both together using the same parameters. The images shown in FIG. 6 have not been resized, but demonstrate that the images from the combined gradients appear twice as large as those from the individual gradients, implying that the FOV has been reduced from 200 mm to 100 mm. The experiments demonstrate that simultaneous operation of the two gradient systems works quite well.

Thus, MR imaging performance can be improved by operating insert gradients in concert with the system whole body gradients. Different MRI studies may place different demands on the performance characteristics of the imaging gradients. Thus, judicious use of composite gradients can better satisfy these varying demands than either whole body gradients or insert gradients alone. Two advantages of composite gradients have been demonstrated.

First, the composite gradients eliminate the need to disconnect the body gradient system when the insert gradient system used. The experiments demonstrate that standard imaging can be performed using the body gradients with the insert gradient system in place. Thus, insert gradient system can be used for special sequences on patients where standard clinical protocols are also required. In conventional MRI systems, where the insert gradients replace the body gradients, it is necessary to perform all imaging sequences as well as apply all required first order shims with the insert gradients. Thus, any advantages brought by the insert gradients are offset by disadvantages of not being able to use the body gradients.

Second, in the composite gradient systems according to embodiments of the invention, the insert gradients and body gradients may be used simultaneously. Not only does their simultaneous use increase the total gradient strength that can be obtained with the insert gradients alone (without increased PNS), but it also improves the homogeneity that can be obtained. The calculations above have shown that echotrain length can be substantially shortened in EPI and TSE sequences, and that repetition time can be reduced in steady state precision sequences.

A large number of experiments using larger phantoms and all axes of the aHGV insert gradient have been performed. These experiments have demonstrated minimal effects due to coupling of the z-gradient with the housing or eddy current-related distortions. For example, the ability to do oblique images has been tested and works well. The image quality obtained using Flash, 3DTOF (3D FLASH), and 2D and 3D TSE with and without the insert gradient system in place have been evaluated. Again, no noticeable coupling or image degradation has been observed.

Imaging with the body gradients with and without the insert gradient system in place gave images with no noticeable differences in distortion or SNR. The image geometry is essentially the same when the insert gradient system is present but not used. Thus, the insert gradient system can be left in the bore of the MRI system, which is advantageous because removing and inserting the insert gradient system can be tedious. It is therefore possible to use images obtained using the body gradients with the insert gradient system in place as baseline images relative to which image distortion and SNR can be measured.

The experiments presented here demonstrate that the gradient systems can be operated independently. There is no evidence of reduced SNR when operating the body gradients with the insert gradient system in place. This enables the performance of a brain scan with conventional gradients and high performance fMRI or DTI scan using composite gradients in the same study. In addition, the high performance fMRI and DTI studies may have reduced distortion and increased coverage in the same imaging time.

Composite gradients may be especially useful in studies involving fMRI, high resolution DTI, intracranial MRA and flow, short TE imaging and many other related applications. The 33 to 44% reduction in EPI echotrain length may have a huge effect on inherently signal starved fMRI where it will allow nearly double the amount of information to be acquired in the same amount of study time. All of these improvements to imaging capabilities may come with no increase, and perhaps even a reduction in PNS.

Gradient pulse sequences may be designed to selectively operate each gradient axis of each system, choosing the desired functionality of each gradient for each gradient pulse.

An insert gradient system may be operated in conjunction with the body gradient system in such a manner that the small gradients are used only for the pulses where the advantages of the insert gradients outweigh the disadvantages.

The experiments show that cross-talk between the gradient systems is very small and may be negligible. Different insert gradient systems may be used to image different parts of a patient. For example, a head insert gradient system may be used to image the brain. For maximum SNR, RF coils may be used that are consistent with each insert gradient system.

The results presented in this disclosure demonstrate that imaging can be performed using an insert gradient system in concert with standard whole-body gradient systems. The images acquired with the insert gradients were not appreciably degraded compared to the images acquired with standard gradients alone. Composite gradients can improve EPI, TSE, and SSFP sequences and may have a strong beneficial impact on fMRI and DTI studies.

Experiments for dual composite gradients where also conducted for an EPI imaging sequence. The experiments were conducted using a composite gradient system having a host/slave configuration (see FIG. 1(b)) and a local transmit/receive surface RF coil. The body gradient system and insert gradient system were operated simultaneously with approximately the same pulse sequence timing to produce composite gradients: $G_{max}$=80 mT/m and $R_s$=400 T/m/s. The insert sensitivity was set to match the body gradients and slice selection was performed using the body gradients.

Figure 7C:
FIGS. 7(a)-(c) show images of a grid phantom obtained with body and composite gradients.
Figure 7B:
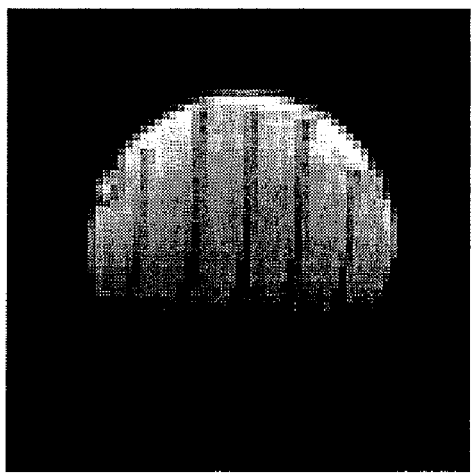
Figure 7A:
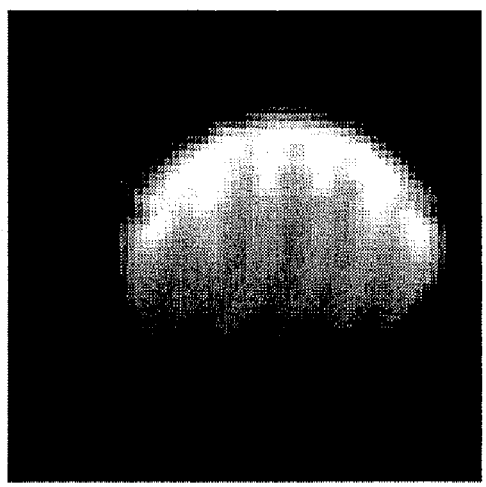

FIGS. 7(a)-7(c) show images of a grid phantom acquired with and without the added insert gradients. FIG. 7(a) shows an image of the grid phantom acquired with only the body gradients and FIGS. 7(b) and 7(c) show images of the grid phantom acquired with dual composite gradients. Table 1 below shows the imaging parameters for each image.

TABLE 1

| Figure | 7(a) | 7(b) | 7(c) |
|---|---|---|---|
| gradients | body | dual | dual |
| FOV(mm) | 300x300 | 150x150 | 150x150 |
| ETL/ESP(ms) | 64/1.01 | 64/1.01 | 128/1.01 |
| BW | 1055 | 1055 | 1055 |
| TE(ms)/TA(ms) | 39/61 | 39/61 | 71/121 |
| In plane Resolution (mm) | 4.7 | 2.3 | 1.2 |

Figure 8B:
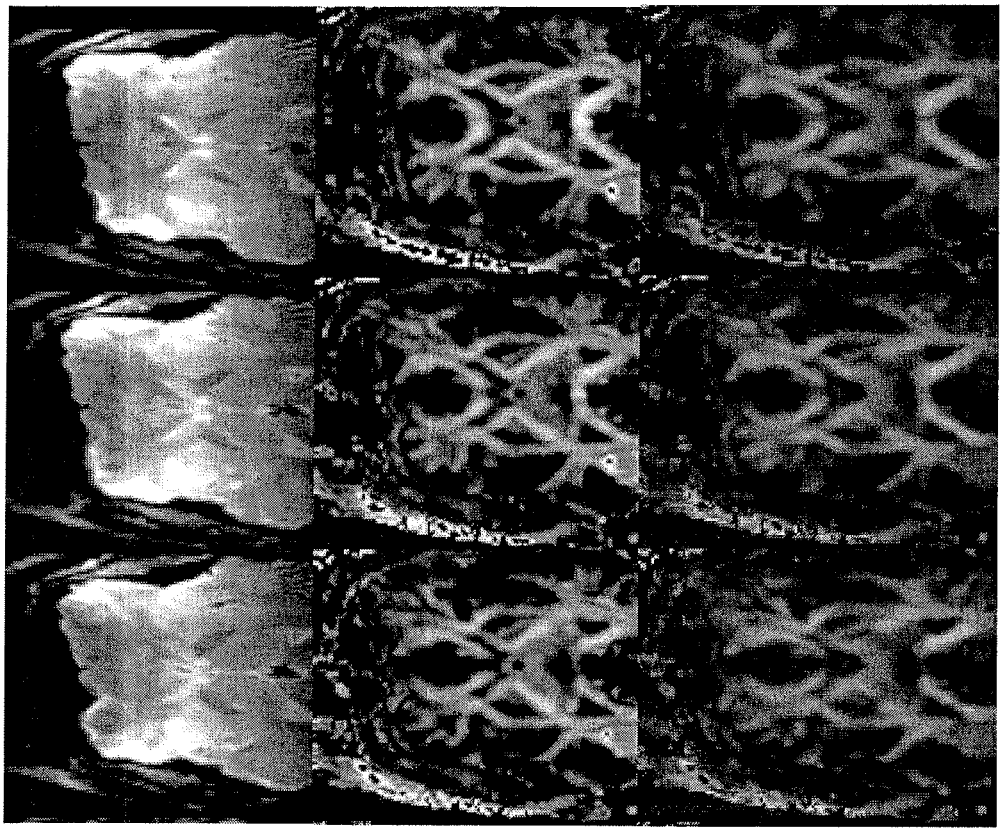
FIGS. 8(a) and 8(b) show diffusion tenor images obtained using body gradients and composite gradients, respectively.
Figure 8A:
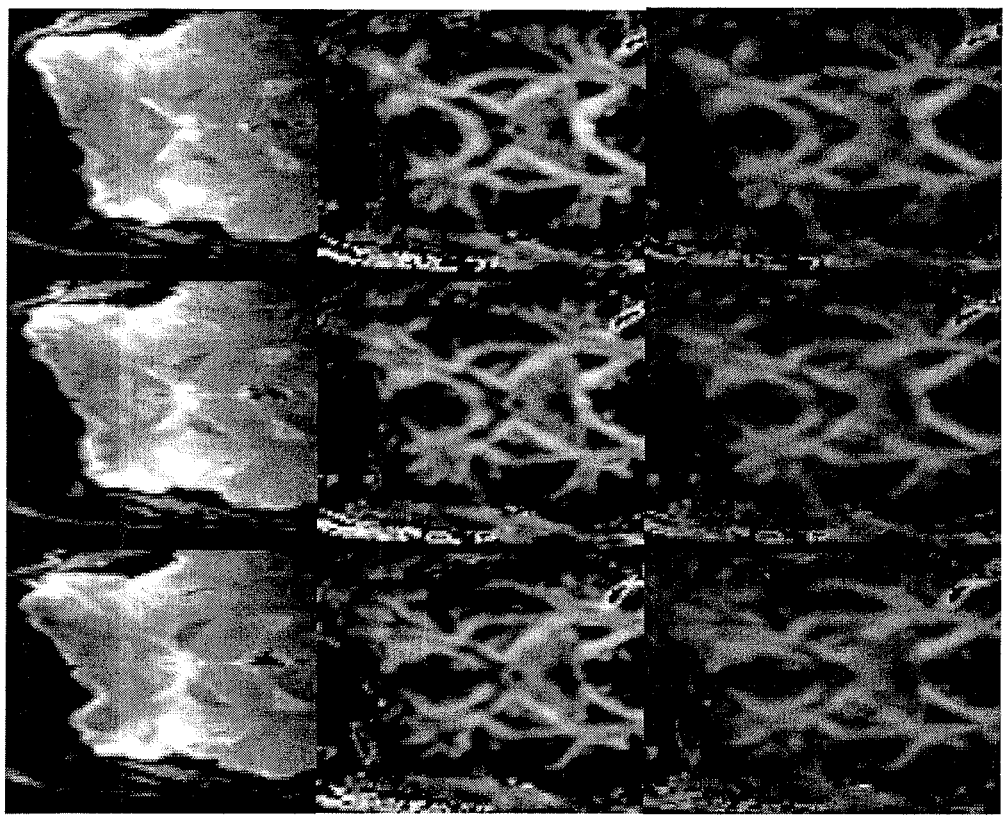

FIG. 8(a) shows diffusion tensor images obtained using body gradients and FIG. 8(b) shows diffusion tensor images obtained using dual composite gradients. In the top row of FIGS. 8(a) and 8(b) show b=0 images. The middle row of FIGS. 8(a) and 8(b) show fractional anisotropy (fa) images. The bottom row of FIGS. 8(a) and 8(b) show color coded images of principal eigenvector direction (green=AP, red=LR, blue=SI). Composite gradient images show much less distortion. The image parameters include b=0, 1000 s/mm$^2$, 12 diffusion directions, and 10 averages. Table 2 below shows imaging parameters for FIGS. 8(a) and 8(b).

TABLE 2

| Figure | FIG. 8(a) | FIG. 8(b) |
|---|---|---|
| gradients | body | Dual |
| FOV(mm)/matrix | 220/144x144 | 220/144x144 |
| ETL/ESP(ms) | 144/0.81 | 144/0.47 |
| BW (Hz/pixel) | 1350 | 2480 |
| TE/T$_{total}$(ms) | 93/116.64 | 78/67.68 |
| In plane Resolution (mm) | 1.5 | 1.5 |

The results presented here demonstrate the following: dual gradients can increase resolution over whole body gradients alone with no change in sequence, resolution can be kept constant to reduce $T_{total}$ and distortion, shorter echotrain in EPI sequences may have a strong beneficial impact on fMRI studies, and improved EPI Diffusion with dual gradients. Similar results can be shown for turbo spin echo (TSE), and steady state free precession (SSFP). Note that peripheral nerve stimulation using the composite system is less than it would be for acquiring equivalent resolution images using whole body gradients, since total gradient field excursion over the entire body is reduced with these combined gradients.

Advantages for using dual gradients versus imaging with a head insert alone include improved linear shimming, an option to use body gradients when homogeneity of gradients is important (slice selection), and the ability to do imaging and or excitation outside the insert region (arterial spin labeling—ASL).

Both in-vivo and ex-vivo experiments were conducted to image and classify carotid plaques. A major goal of carotid MRI has been to improve image quality and thereby improve the use of MRI in the characterization of carotid plaques. While ex-vivo experiments benefit from the high image quality of small bore specimen scanners, in-vivo experiments are limited by a variety of factors associated with clinical scanners, one such factor being limited spatial resolution.

Increased gradient performance in a high field (3T), clinical MRI scanner can significantly improve plaque image resolution and, ultimately, the diagnostic utility of in-vivo carotid MRI. To demonstrate this, several experiments were performed in a composite gradient system comprising an insert gradient system which can be used in conjunction with the whole-body gradient system of a clinical scanner to increase image resolution. Excised carotid plaques with and without the insert gradient system were scanned and the quality of the resulting images compared.

Carotid plaque specimens were obtained from patients undergoing endarterectomy and immersed in a saline solution to reduce susceptibility effects caused by air. Imaging was performed on the Siemens 3T TIM Trio scanner (Siemens Medical, Erlangen Germany) using a transmit/receive RF wrist coil. The standard system was augmented with a gradient coil insert having three additional gradient amplifiers and waveform generators. These additional gradient coils were controlled by a computer operating as a slave to a master host computer. For all experiments, the master and slave computers executed identical pulse sequences, with the master controlling the system body gradient coils and the slave controlling the amplifier currents in the gradient coil insert. Although the gradient coil insert has efficiencies of roughly 0.4 mT/m/A and is therefore capable of very large gradients, it was operated with gradient strength identical to the body gradient coils for the experiments.

Figure 9:
FIG. 9(a)-(c) show images of carotid plaque using body gradients, composite gradients and a CT scan, respectively.
Figure 9:
Figure 9:

For the specimen shown in FIG. 9, five sets of images with different MR contrast were obtained: T1w (TE/TR=12/600 ms), T2w (TE/TR=65/1500 ms), PDw (TE/TR=12/1500 ms), 3D MPRAGE with inversion recovery (TI/TE/TR=700/2.31/1500 ms), and diffusion weighted rFOV EPI (b=1000 s/mm$^2$). FIG. 9(a)-(c) show RGB (T1, T2, MPRAGE) images of a carotid specimen using only the body gradient coils (FIG. 9(a)), and using the composite gradient system (FIG. 9(b)), and an image using a micro-CT scan showing calcification at the same location (FIG. 9(c)). The slice thickness was 0.5 mm for both gradient modes and in-plane image resolution was 500×500 μm$^2$ with the body gradient only (FIG. 9(a)) and 250×250 μm$^2$ with the dual gradient system (FIG. 9(b)). FIG.

9 illustrates the increased image resolution obtained using the dual gradient system. Plaque features such as calcification are more clearly delineated in the higher resolution in FIG. 9(b). Using as a reference the corresponding micro-CT image (FIG. 9(c)) it can be noted that internal regions of fibrous tissue which are surrounded by calcium, are more clearly represented in the image obtained using the dual gradient system.

The increased gradient performance of the dual gradient system results in higher resolution plaque images. The dual gradient system may be used to overcome some of the spatial resolution limitations of clinical whole body scanners, and may be used to improve human carotid MR studies by providing the means for high resolution imaging using clinical whole body scanners.

Experiments were also conducted for imaging the inner ear. The diagnosis of inner ear pathology has been historically subjective. High resolution MRI of the temporal bone enables the diagnosis of certain diseases such as acoustic neuroma and cochlear fibrosis. Resolution of the fine ultrastructure of the cochlea remains elusive given the limits of standard MRI gradient systems. Endolymphatic hydrops, the pathologic inner ear state associated with Meniere's disease, has only been seen in histopathologic preparation in humans. Clinical diagnosis remains subjective, based on history and audiometric evaluation. Although early studies using high resolution MRI in high field small bore MRI scanners have allowed detection of hydrops in animal models, current human MRI systems do not allow for the objective diagnosis of hydrops in humans.

Improved images of the cochlear infrastructure may be obtained using a composite gradient system which has increased gradient performance. The composite gradient system comprises a head and neck insert gradient for simultaneous use with the whole body gradients of a 3T research MRI scanner. The use of dual gradients allows double or triple resolution without increasing repetition time or bandwidth. This decreases artifact and noise, allowing for improved cochlear imaging. To test the utility of the composite gradient system we scanned the temporal bone of guinea pigs with the whole body gradients alone and then with the dual gradients and compared image quality.

Deceased guinea pigs were placed in a RF transmitting/receiving wrist coil. Imaging was performed on the Siemens 3T TIM Trio scanner (Siemens Healthcare AG, Erlangen Germany). The standard system was augmented with three additional gradient amplifiers and master/slave configured computers capable of controlling extra RF and gradient channels (see FIG. 1(b)). A separate pulse sequence was used to control each gradient set. For these experiments, the master computer served four purposes: 1) to maintain the first-order gradient shims using the standard system gradients, 2) to control RF excitation and reception 3), to control the standard system gradients for imaging and 4) trigger the slave computer. The slave computer executed a pulse sequence controlling the head gradient insert coil.

Figure 10B:
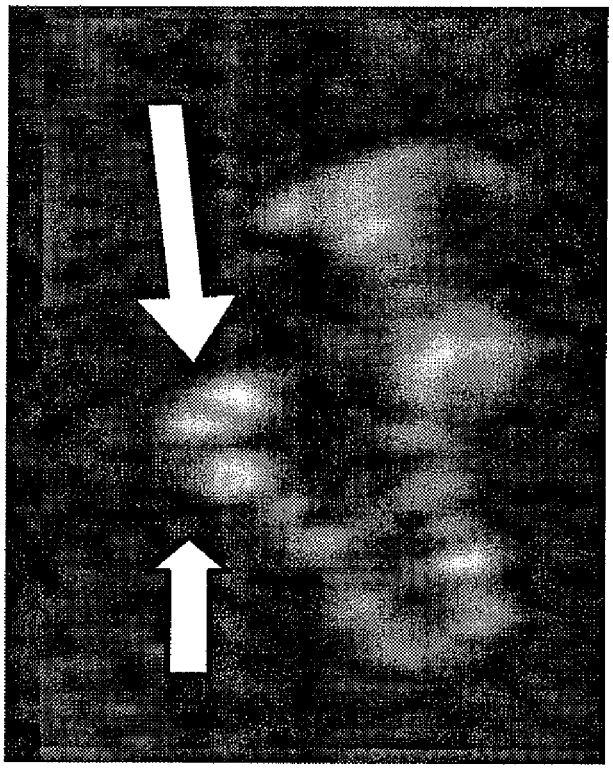
FIG. 10(a)-(b) show images of a cochlea using body and composite gradients, respectively.
Figure 10A:
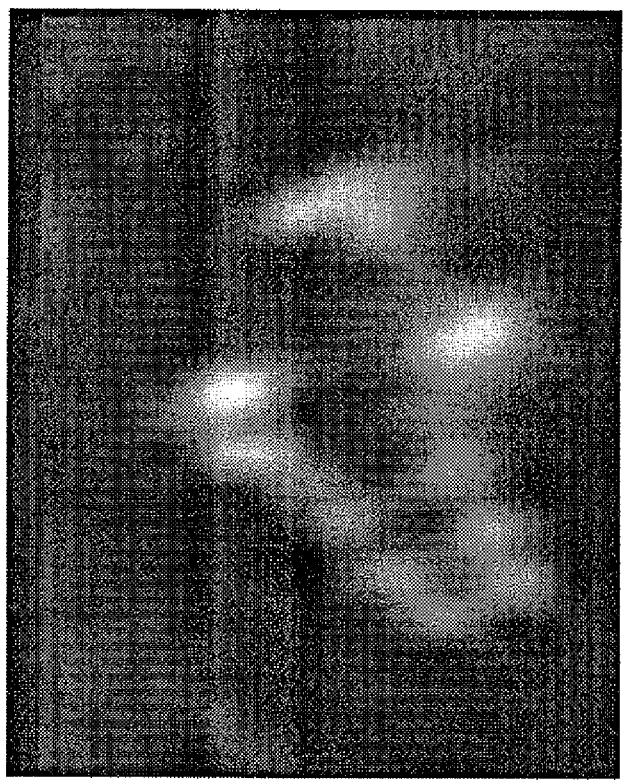

The T2 weighted images of a guinea pig cochlea in FIG. 10 were obtained using constructive interference in steady state (CISS) with TE/TR 6.38/12.76 ms, bandwidth=130 Hz/pixel, with slice thickness=0.3 mm. Other parameters are summarized in Table 3 below. The increased acquisition time does recover some of the SNR lost in the higher resolution images. FIGS. 10(a) and 10(b) show enlargements of Axial T2 weighted CISS images of normal guinea pig cochlea using body gradients alone (FIG. 10(a)) and composite gradients (FIG. 10(b)). In the image using the body gradients alone (FIG. 10(a)) it is possible to see the apical 3 turns, and in composite gradient system (FIG. 10(b)), in addition to the turns it is possible to visualize the cochlear chambers scala vestibuli (large arrow) and scala tympani (small arrow) in the basilar turn.

TABLE 3

|  | Body | Dual |
| --- | --- | --- |
| FOV(mm) | 50X100 | 37.5x50 |
| Matrix | 160x320 | 240x320 |
| Acquisition Time (min) | 6:33 | 9:50 |
| Inplane Resolution (min) | 0.3x0.3 | 0.15x0.15 |

The improved resolution seen with the composite gradient system not only demonstrates better visualization of the cochlea, but may actually allow for differentiation of the cochlear fluid compartments. High resolution imaging of the inner ear in humans is but one potential utility of the composite gradient system which allows for the simultaneous use of insert gradients and body gradients. This system may be particularly useful clinically in that in addition to the improved imaging obtained with the composite system over insert gradient coils alone, it allows for the use of body gradients alone for conventional clinical studies without the need for removing the insert gradients. Comparisons showing improved visualization of cochlear infrastructure in animals demonstrate the potential of this system to resolve the fine detail of the human cochlea in a way in which that an objective test for the diagnosis of inner ear pathology can be realized.

Certain embodiments of the present invention provides a small-bore insertable gradient system with two linear gradient imaging regions and an RF system capable of transmitting or receiving in both regions simultaneously.

Designs for conductor placement for two-region X-, Y- and Z-gradient coils were optimized by simulated annealing. Wire patterns for each axis were chosen that gave low inductance, reasonable homogeneity over a large imaging volume and high efficiency (gradient field per-unit-current).

Imaging was performed on a Siemens 3T TIM Trio scanner equipped with three additional gradient amplifier channels and a second RF/gradient array controller. Phantoms were placed in the two imaging regions as well as the central non-imaging region to test gradient homogeneity and crosstalk between regions. Images acquired simultaneously in the two regions showed very little signal crosstalk between imaging regions and even less signal from the central, non-imaging region.

When combined with an overlapping single-region gradient insert, extended field-of-view (FOV) imaging is possible without moving the table or the subject and without increasing nerve stimulation.

Figure 11:
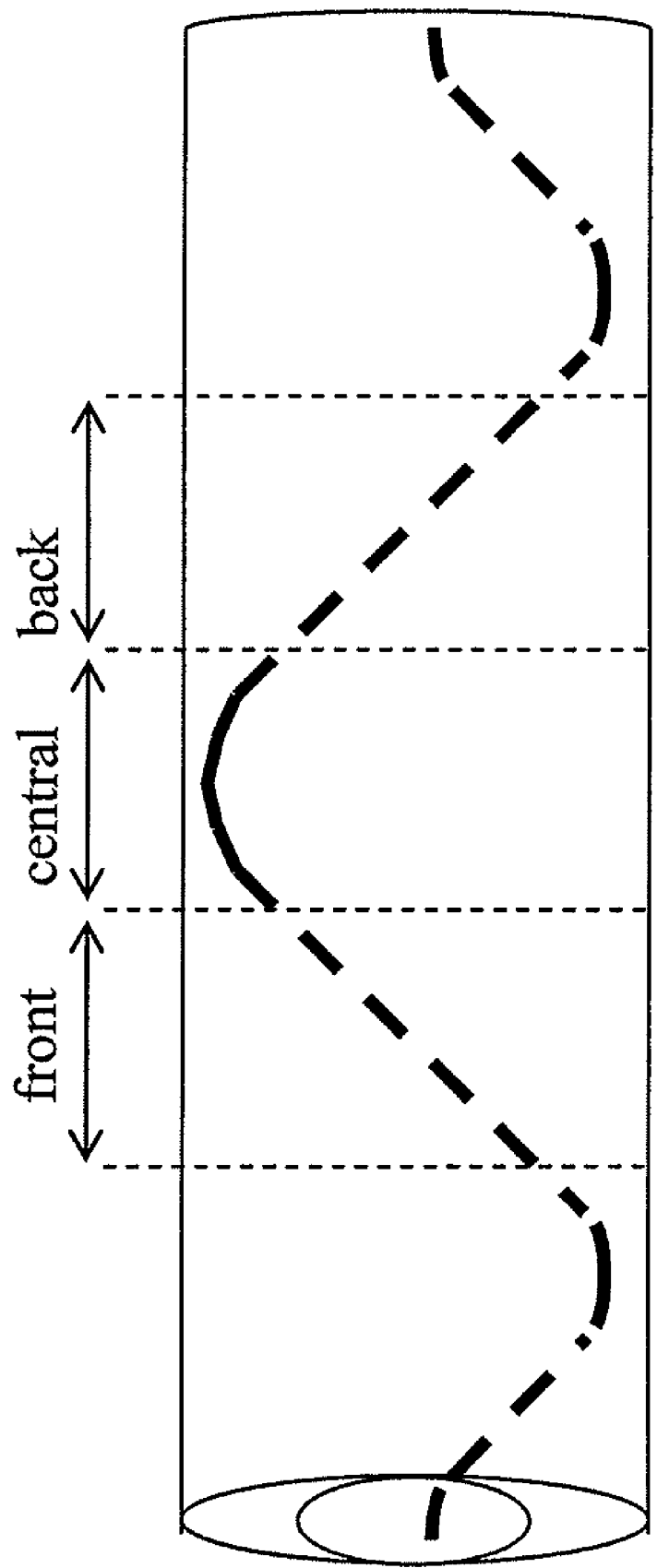
FIG. 11 is a schematic of a gradient insert with two separate imaging regions according to an embodiment of the present invention.

A small-bore insertable gradient coil with two linear gradient regions of opposite polarity is shown in FIG. 11 according to an embodiment. FIG. 11 shows a schematic for the gradient insert with two separate imaging regions of opposite polarity. The dashed line indicates the Z-gradient field, which is linear in the front and back regions. Transverse gradient fields generated by the insert for the front and back region are also opposite polarity.

Nerve stimulation can be caused by rapidly changing magnetic fields, specifically the rate of change and the magnitude of the field excursion. As demonstrated in FIG. 12, a two-region gradient can have the same maximum slope (in mT/m) as a single region gradient and yet much smaller maximum excursion. This is the redeeming feature to justify the extra hardware and difficulty of a multiple region gradient set.

Figure 12:
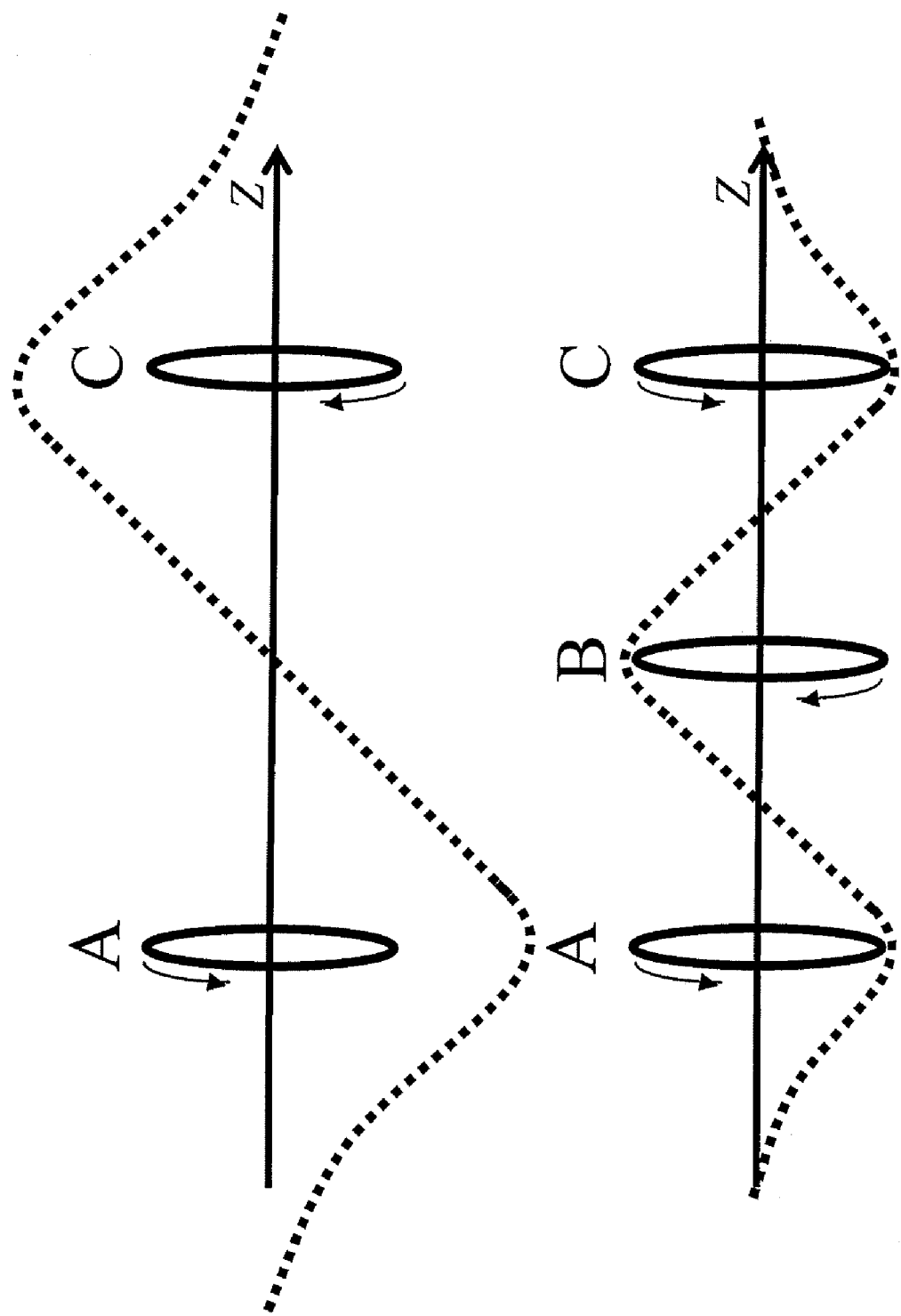
FIG. 12 shows a comparison of gradient slope and excursion of a single region configuration and double region configuration.

More particularly, FIG. 12 shows a comparison of gradient slope and excursion of a single region configuration (top) and double region configuration (bottom). In the top diagram coils A and C have current in opposite directions and result in a somewhat linear gradient field in the volume between the coils (dotted line). By having the current in A and C in the same direction and another coil (B) with current in the opposite direction a double region gradient field is created. The slope of the dotted lines is an indication of the change of B field. Notice that the slope of the gradients are equal (this makes the resolution of both systems equal) but the excursion of the gradient B-field is much less for the double region gradient which means potential nerve stimulation is less for the double region. Arrows indicate current direction.

Figure 13:
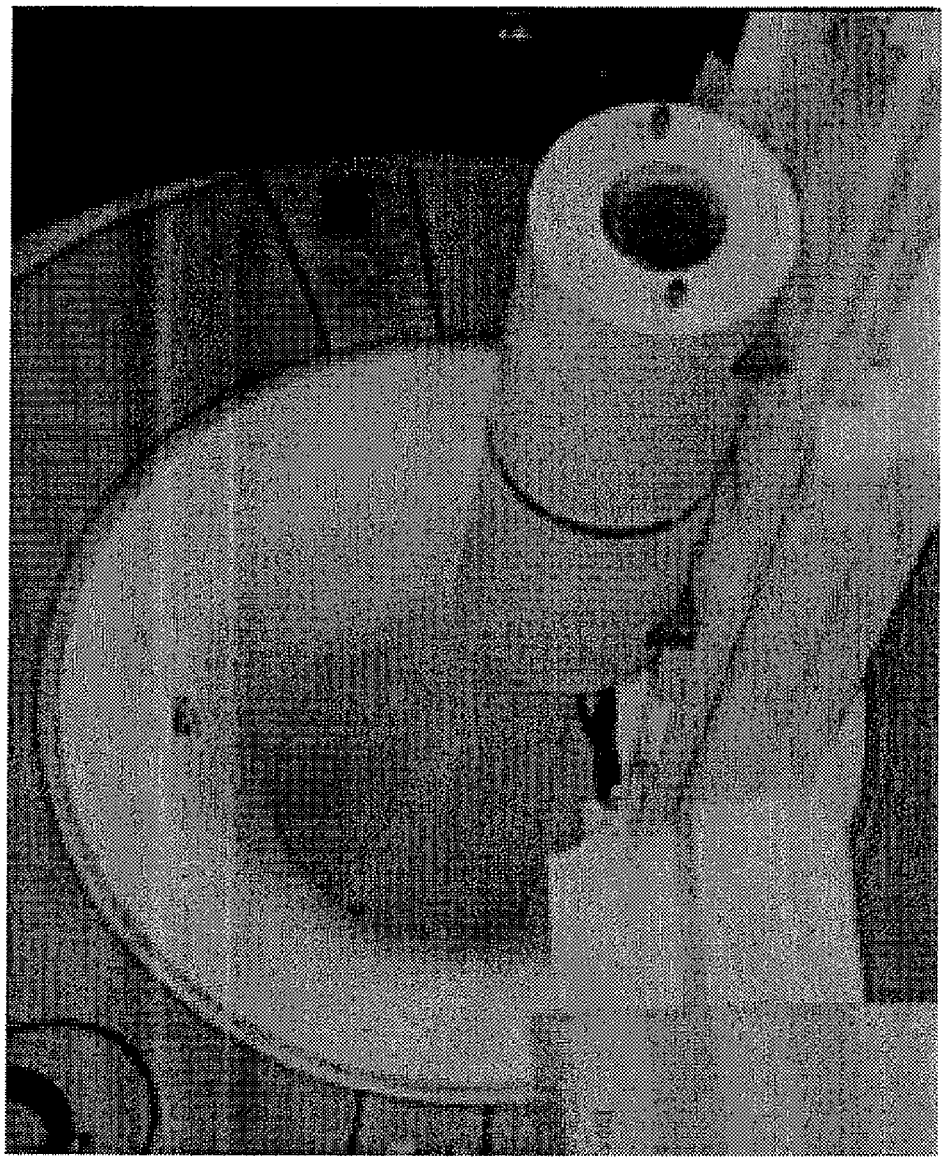
FIG. 13 shows a double-region insert gradient on an imager table.
Figure 14:
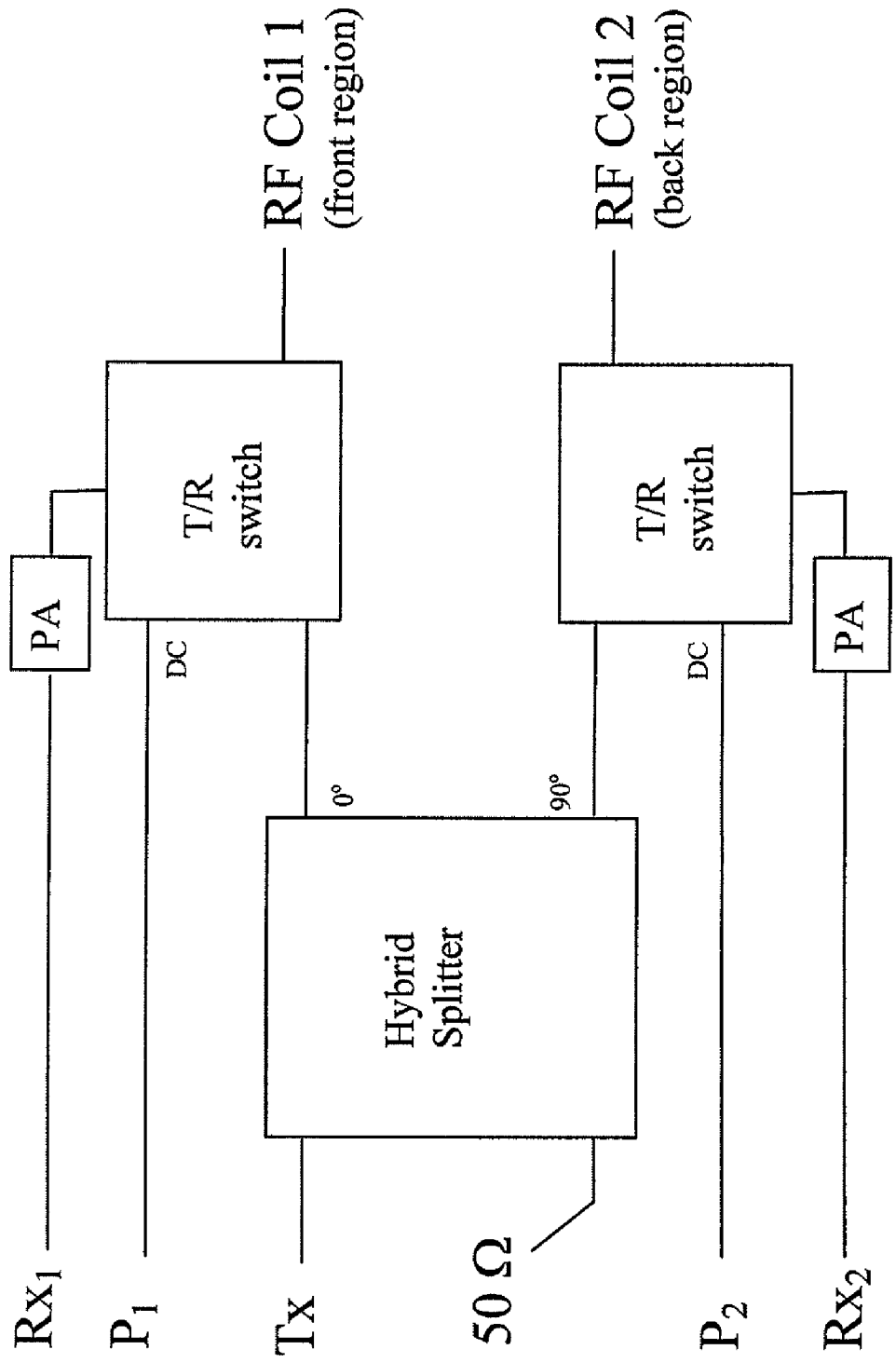
FIG. 14 shows an RF coil array system according to an embodiment of the present invention.

FIG. 13 shows gradient coil insert interfaced with a Siemens TIM Trio 3 Tesla MRI scanner equipped with two gradient amplifier systems. FIG. 14 shows an RF Transmit/Receive (Tx/Rx) coil array capable of transmitting or receiving in both regions simultaneously. The RF coil array system includes a Tx hybrid splitter for two RF surface coils for simultaneous transmission and reception in both gradient regions. The RF coil array system also includes preamplifiers (PA) and DC biases (P1 and P2) to activate the T/R switches. When combined with an overlapping single-region gradient insert capable of generating imaging gradients in the central region, extended FOV imaging is possible without table motion.

Figure 15:
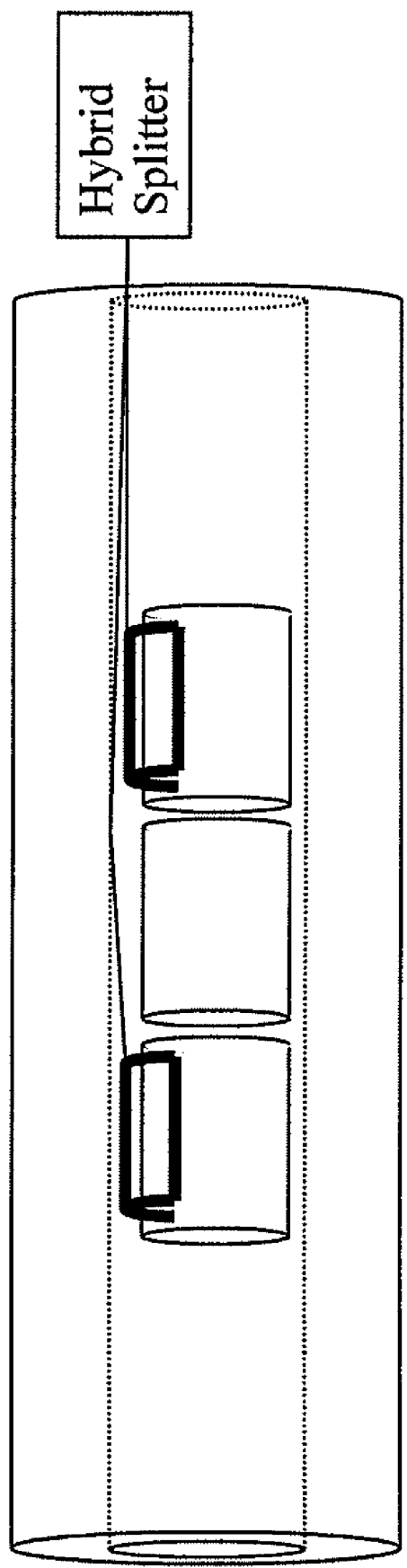
FIG. 15 illustrates the spatial relationship of three cylindrical phantoms and two RF coils within the gradient insert.

The dimensions of the two-region gradient insert were constrained by the diameter of the homogenous spherical volume (DSV) of the main $B_0$ magnetic fields of the commercial human MRI scanners used to test the insert. The maximum DSV of the commercial MRI system available was approximately 50 cm. The Z-extent of the DSV was divided into three equal regions (compare FIGS. 11 and 15). FIG. 15 illustrates the spatial relationship of the three cylindrical phantoms and two RF coils (bold lines) within the gradient insert. In one embodiment, the two outer imaging regions were 17 cm in length along the magnet bore (Z-dimension) and were separated by a 17-cm non-imaging space.

Standard plastic piping for the gradient former were chosen to be of radii large enough to allow for reasonably large phantoms and RF coils yet small enough so that the gradient insert might be centered in the clinical system bore, as well as to keep the weight of the insert manageable. We chose 6-, 8- and 10-inch-inner-diameter (i.d.) schedule-40 polyvinyl chloride pipe (15.2, 20.3 and 25.4 cm) for formers of the X-, Y- and Z-coil windings, respectively, and a 12-inch-i.d. (30.5 cm) pipe to enclose the system. Actual diameters of the conductor winding cylinders were 17.21, 22.29 and 27.69 cm for the X-, Y- and Z-windings, respectively.

Designs for conductor placement for two-region X-, Y- and Z-axis coils were individually generated with software developed using the stream function approach and optimized by simulated annealing. Other methods for gradient design can be used. We explicitly computed coil inductance, efficiency, gradient homogeneity and magnitude of the B-field, which is important because it is the rapid change in the B-field that induces nerve stimulation. Figures of merits (FOM) for characterization of potential performance of the gradients were optimized by a simulated annealing algorithm. For the axial gradient, $FOM_z = \sqrt{L}\sigma/\eta$, where L is inductance, $\sigma$ is root mean square of the deviation from desired field gradient, and $\eta$ is gradient efficiency (gradient strength/unit current). For the transverse axes, $FOM_{xy} = FOM_z\sqrt{B_{0max}}/\eta$ and $B_{0max}$ is maximum field at 5/6 of the radius of the bore. Calculation of the field at 5/6 of the winding radius was chosen in order to get a qualitative comparison of the potential for nerve stimulation. The field at this radius is outside the imaging volume (assumed to be 3/4 of the radius) and yet still within the subject being imaged.

Figure 16:
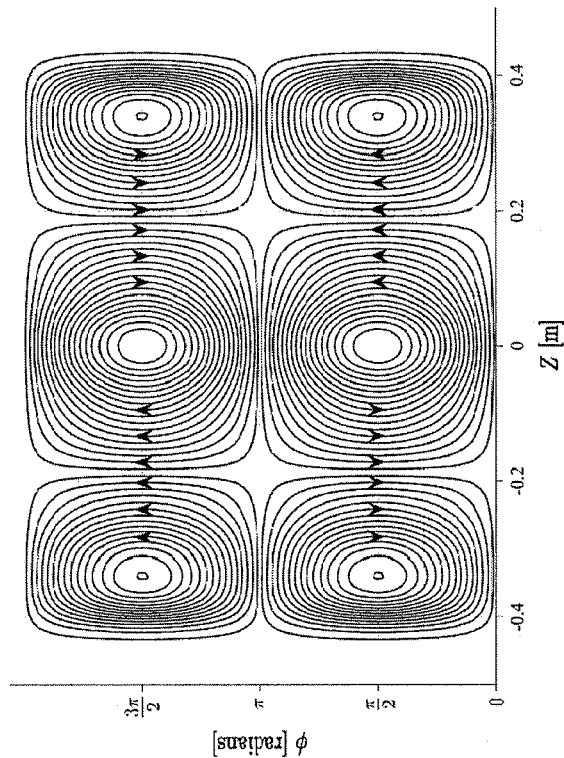
FIG. 16 shows the wire patterns for the double-region gradient insert according to an embodiment of the present invention.
Figure 16:
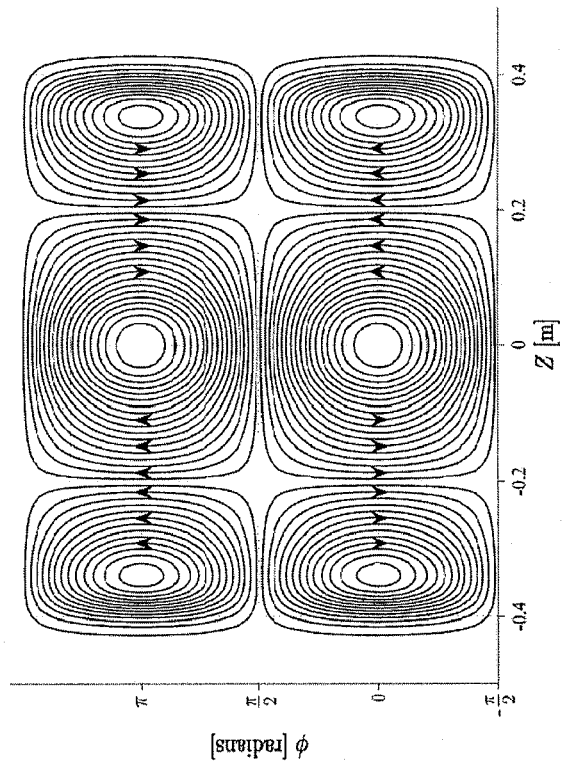
Figure 16:
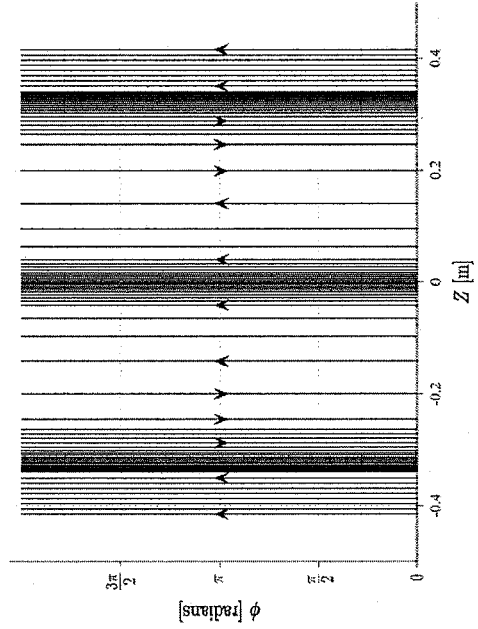

During the simulated annealing process all solutions were saved and used to generate a feature space with 3 axes: 1) $\eta_n = \eta/\sqrt{L}$, 2) $\sigma$, 3) $B_{0max}^2$. After the three-dimensional feature space was generated, two-dimensional projections were used to help visually compare homogeneity, efficiency/inductance and maximum B-field tradeoffs for different operating points. After operating points were chosen for each axis the software generated wire patterns (FIG. 15). The wire patterns used to construct the double-region insert gradients are shown in FIG. 16 where the arrow heads indicate relative direction of current. These conductor patterns were chosen from operating points of feature space with homogeneity and normalized efficiency ($\eta_n = \eta/\sqrt{L}$) as the most heavily weighted considerations. Many of the solutions in this feature space had reasonable maximum B-field so we were able to choose a solution with excellent homogeneity, efficiency, and low inductance without being limited by maximum B-field considerations.

To construct the insert gradient, the chosen wire patterns were milled with a ball-nose cutter into flat sheets of polytetrafluoroethylene (PTFE) that were treated on one side for improved adhesion with glues. These sheets were bonded with an adhesive to the pvc pipe forms and 12 AWG copper wire was inserted into the milled grooves. Thin-walled PTFE tubing for water-cooling was placed between layers. MRI compatible (Type-E) thermocouples were fastened to the X, Y, and Z conductors at regions of highest current density. The voids between axes were filled with epoxy that was poured into the insert and left to harden for mechanical stability. The epoxy potting compound (Durapot 865, Cotronics Corporation, New York) was specially chosen to have a high thermal conductivity (2.9 W/m/K) allowing efficient heat transfer from the winding layers to the cooling layers.

Prior to imaging, the coil's inductance, capacitance, and resistance were characterized over a frequency range of 12 Hz to 10 kHz using a GW Instek LCR meter model number LCR-817.

In order to quantify the thermal performance of the coil, two methods of temperature measurement were employed. The first method measured temperature directly from thermocouples placed inside the coil during construction. Every attempt was made to position the thermocouples at the point of greatest wire density and hence highest temperature region for each gradient axis. A second temperature method was employed that measures the average coil temperature via the change in resistance of the copper wire. To facilitate these measurements, a LabView 7.1 Virtual Instrument (VI) was created to interface with the thermocouples and Agilent 34420A Ohm Meter. This VI directly recorded thermocouple temperatures and calculated the average coil temperature from resistance measurements recorded every five seconds.

An exponential model proved suitable for both the heating and cooling characteristics of this coil. For the heating portion of the experiment, the data were suitably fit by the function:

$$T(t) = T_0 + \Delta T(1 - e^{t/t_{heat}}).$$

For each gradient axis, the heating time constant, $t_{heat}$, and asymptotic temperature rise, $\Delta T$, was determined by driving the axis with 75A DC for 30 minutes with forced-water-cooling. A fit of a simple exponentially decaying function with cooling time constant, $t_{cool}$, was fit to the temperature data recorded as the system was left to cool for 30 minutes in the idle state with the water cooling flowing. The water cooling system was run with 15° C. tap water with a flow rate of ~6 L/min.

Imaging was performed on the Siemens 3T TIM Trio scanner (Siemens Medical, Erlangen Germany). The standard system was augmented with three additional gradient amplifiers and master/slave configured computers capable of controlling extra RF and gradient channels. The control hardware and software were developed and provided by Siemens. Two-region RF excitation and detection were accomplished by feeding a single transmit pulse to both 17-cm-long Tx/Rx surface coils via a splitter and using a separate Rx channel for each coil as illustrated in FIG. 14. The RF coils and phantoms were placed inside the bore of the insert. RF coils were placed on top of the outer 2 phantoms (see FIG. 15). A separate pulse sequence was used to control each gradient set. For these experiments, the master computer served three purposes: 1) to maintain the first-order gradient shims using the standard system gradients, 2) to control RF excitation and reception and 3) trigger the slave computer. The slave computer executed a pulse sequence controlling the amplifier currents in the double-region gradient insert.

The 17-cm-long, 12.7-cm-diameter (5" o.d.) hollow cylindrical phantoms contained a plastic grid and were filled with CuSO4-doped water. $T_1$ and $T_2$ relaxation times were approximately 300 ms measured at 3T. Phantoms were placed in the two imaging regions as well as the central non-imaging region to test gradient homogeneity and crosstalk between regions.

All images presented here were acquired with a fast low-angle shot (FLASH) pulse sequence. Ranges for acquisition parameters were as follows: repetition time (TR) 8.6 to 25 ms, echo time (TE) 2.8 to 6 ms, bandwidth (BW) 200 to 320 Hz/pixel, slice thickness (SL) 2 to 7 mm, field of view (FOV) 180×180 mm to 480 mm×480 mm, and image matrix 256× 256 pixels to 460×512 pixels.

All measurements were made using magnitude images. For coronal localizer images obtained using standard gradients, four-sided polygon ROIs were chosen to include all signal from each of the three phantoms. For each axial and coronal image, one ROI was chosen that contained coherent signal only from the intended region and a second ROI was chosen to contain signal from the opposite region. A third ROI was chosen in the noise.

Inductance and resistance measurements for each axis as a function of frequency from 12 Hz to 10 kHz are displayed in Table 4.

TABLE 4

| | Inductance(μH) | | | | | Resistance(Ω) | | | | |
|---|---|---|---|---|---|---|---|---|---|---|
| Axis | 12 Hz | 100 Hz | 1 kHz | 5 kHz | 10 kHz | 12 Hz | 100 Hz | 1 kHz | 5 kHz | 10 kHz |
| X | 233 | 235 | 235 | 232 | 233 | 0.177 | 0.179 | 0.174 | 0.178 | 0.311 |
| Y | 289 | 292 | 292 | 289 | 289 | 0.211 | 0.214 | 0.209 | 0.213 | 0.416 |
| Z | 316 | 318 | 318 | 315 | 316 | 0.216 | 0.219 | 0.214 | 0.221 | 0.403 |

Mutual inductance and capacitance between axes as a function of frequency are displayed in Table 5.

| | Capacitance (pF) | | | | | Mutual Inductance (μH) | | | |
|---|---|---|---|---|---|---|---|---|---|
| Axis | 12 Hz | 100 Hz | 1 kHz | 5 kHz | 10 kHz | 100 Hz | 1 kHz | 5 kHz | 10 kHz |
| XY | 1190 | 869 | 755 | 725 | 718 | 0.54 | 0.54 | 0.53 | 0.52 |
| XZ | 927 | 545 | 428 | 402 | 396 | 0.86 | 0.85 | 0.70 | 0.81 |
| YZ | 1348 | 1015 | 848 | 808 | 799 | 0.42 | 0.40 | 0.39 | 0.35 |

Table 6 illustrates the temperature rise for each gradient axis under the conditions described in the Methods section. The columns labeled "Temp Rise" are the asymptotic temperature rises for each axes for a 75A DC current extrapolated for infinite duration from the fit of the temperature model to the acquired data. Of the three gradient axes, the Z-axis experienced the largest temperature rise. This is most likely because this wire pattern contains the most wire and thus largest resistance. The average temperature of the Z-axis rose 37° C. while the thermocouple showed a temperature rise at the point of greatest wire density of 51° C. Both figures represent safe operating temperatures.

TABLE 6

| | Average Temperature | | | Thermocouple Temperature | | |
|---|---|---|---|---|---|---|
| Axis | Temp Rise [° C.] | $t_{Heat}$ [s] | $t_{Cool}$ [s] | Temp Rise [° C.] | $t_{Heat}$ [s] | $t_{Cool}$ [s] |
| X | 38.32 | 533 | 573 | 38.32 | 533 | 677 |
| Y | 31.76 | 299 | 357 | 31.76 | 299 | 474 |
| Z | 37.03 | 339 | 348 | 37.03 | 339 | 317 |

The two temperature measurement methods are consistent and show that the Z-axis runs the hottest followed by the X-axis, and the Y-axis. While the thermocouple measurements from the X- and Y-axes report smaller temperature rises than their respective average temperature rise, this is likely the result of the thermocouples having been displaced during coil potting. This illustrates the usefulness of the average temperature method which is not susceptible to this problem and does not require thermocouples to be included in the early designs.

The thermal performance testing shows that the cooling system effectively removes deposited power from the coil, and that the coil can be operated continuously in a nondestructive manner.

Three-plane localizers were acquired using the standard Siemens gradients and our custom-built Tx/Rx RF coils. Coronal localizer images are displayed in FIG. 17 with and without gradient field inhomogeneity compensation image reconstruction to demonstrate the need for field-homogeneity compensation using the standard gradients across a large FOV.

Figure 17:
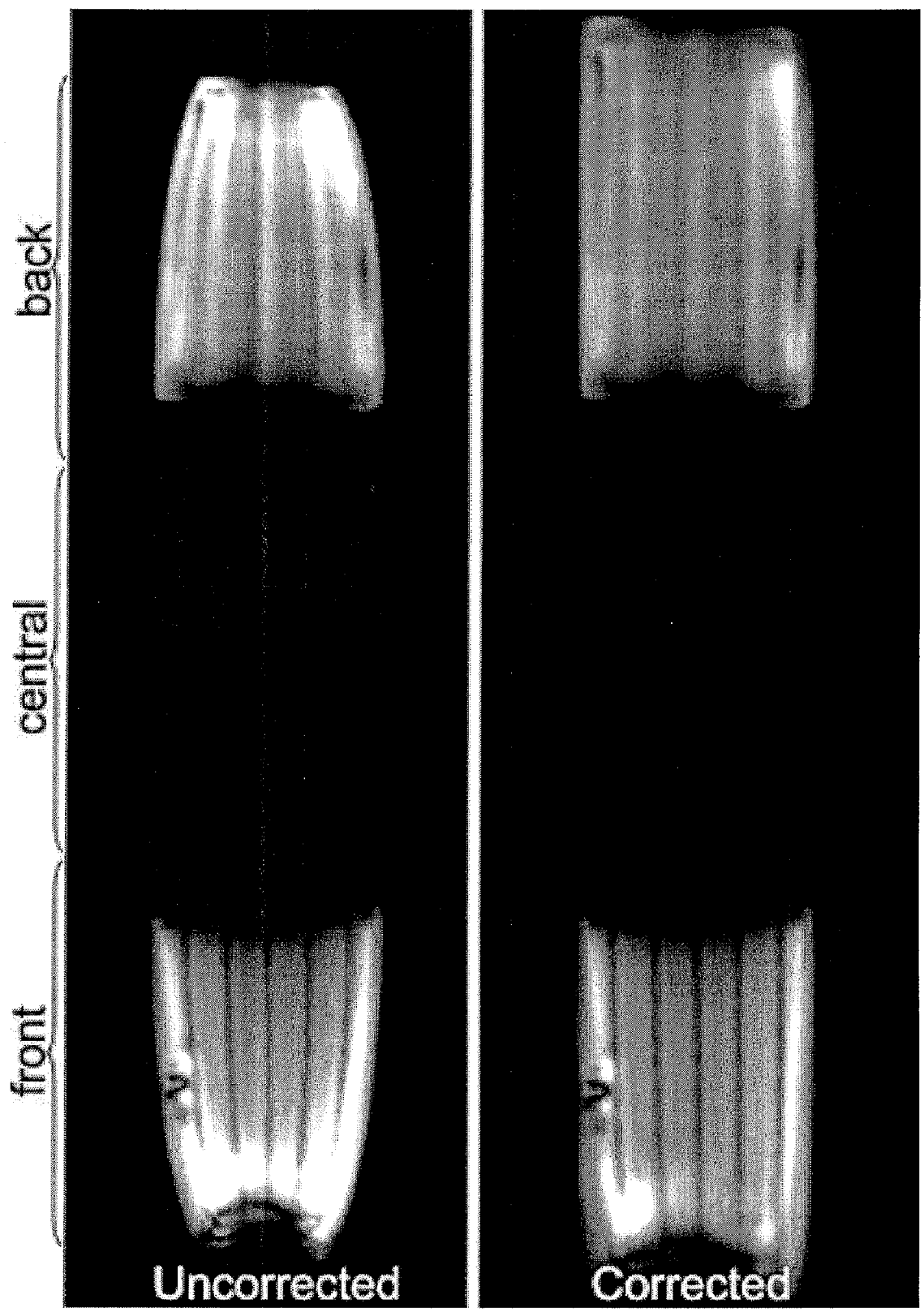
FIG. 17 shows coronal localizer images.

In FIG. 17, uncorrected images are shown in the left panel and distortion-corrected images in the right. Imaging parameters: TR=8.6 ms, TE=2.8 ms, BW=320 Hz, SL=7 mm, FOV=480 mm×480 mm, image matrix=460×512 pixels.

Faint signals from the phantom located in the central region can be seen with appropriate display parameters. The signal from the central region is less than 5% of that in either the front or rear regions.

After localizer acquisition we simultaneously acquired axial images in the front and back regions. For this acquisition, the slave computer was used to control the insert gradients as imaging gradients while the master computer controlled the RF transmission and reception. Example axial images are displayed in FIG. 18. These images are not processed to compensate for gradient field inhomogeneity. We also acquired sagittal and coronal images using the same computer control described above for axial acquisition. Example coronal images are displayed in FIG. 19.

Figure 18:
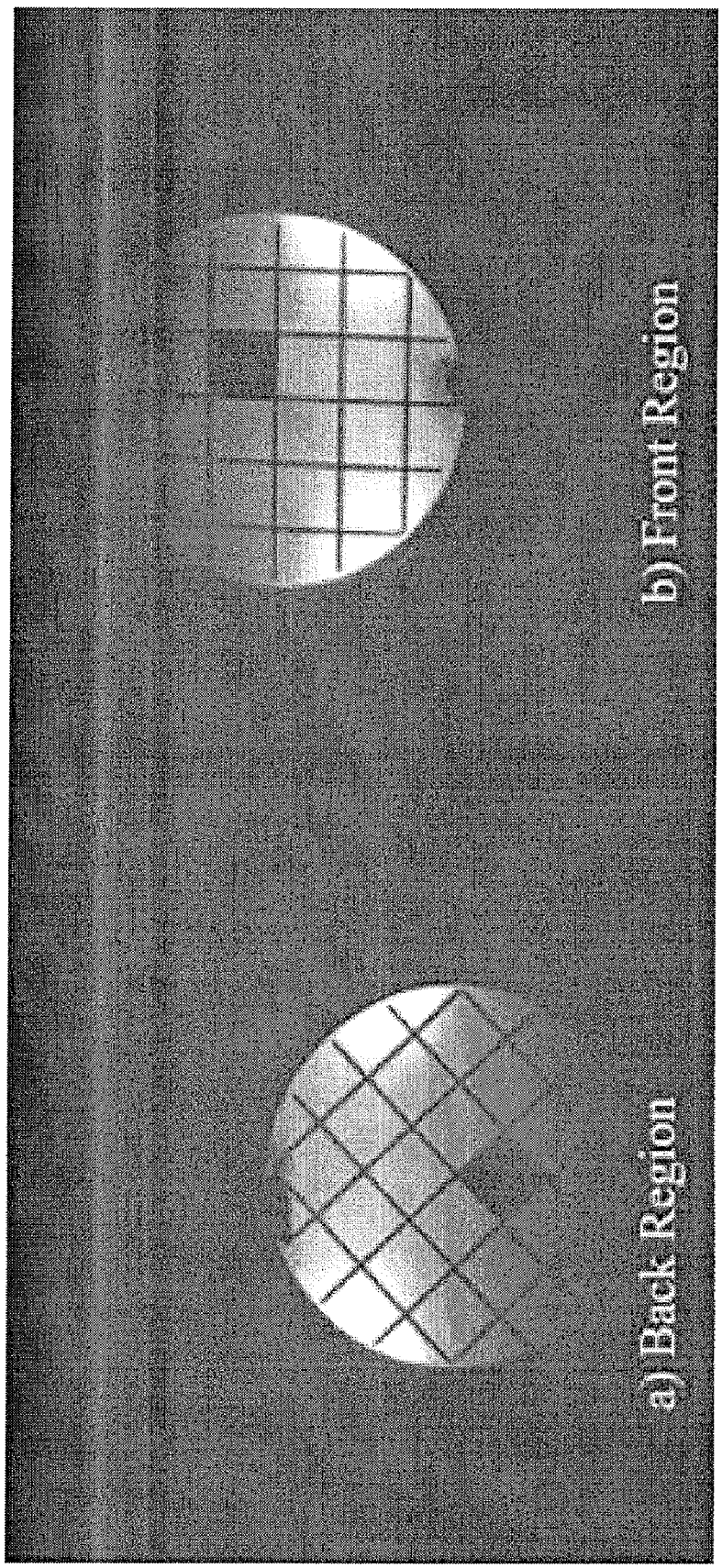
FIG. 18 shows axial GRE images of grid phantoms acquired in the back and front regions of the gradient insert.

More particularly, FIG. 18 shows axial GRE images of the grid phantoms acquired simultaneously (a) in the back region of gradient insert (correct gradient polarity) and (b) front region of gradient insert (reversed gradient polarity, notice air bubbles). Imaging parameters: TR=9.1 ms, TE=4.8 ms, BW=390 Hz, SL=5 mm, FOV=180 mm×180 mm, image matrix=256×256 pixels.

Figure 19:
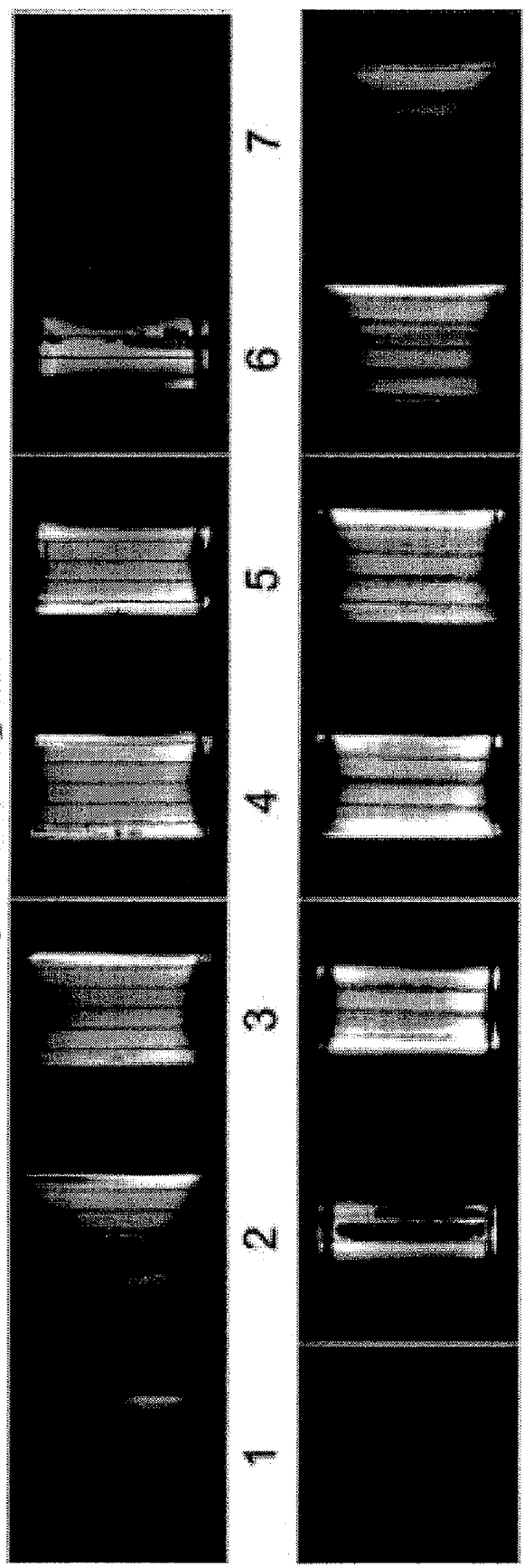
FIG. 19 shows coronal GRE images of the grid phantoms acquired in the back and front regions of the gradient insert.

FIG. 19 shows coronal GRE images of the grid phantoms acquired simultaneously (a) Top row of images are from the front region of gradient insert and (b) bottom row of images are from the back region of the gradient insert. The numbers between the rows indicate the order of acquisition. Images with the same number were acquired together; however, since the polarity is reversed in the imaging regions, the order of acquisition is from top to bottom in the front and from bottom to top in the back. Imaging parameters: TR=9.1 ms, TE=4.8 ms, BW=390 Hz, SL=5 mm, FOV=180 mm×180 mm, image matrix=256×256 pixels.

We observed out-of-region signal (stray signal) from the opposite region as well as the central region. Stray signal was always less than 5% of the maximum signal. When care was taken to isolate RF coil connecting wires from conducting surfaces within the insert bore even less stray signal was evident. Mean signal from the central phantom from the localizer shown in FIG. 17 was the worst with stray signal from the central region at 4.7% of the mean from the adjacent phantom. Stray signal from axial images in FIG. 18 was entirely from the opposite region. Mean crosstalk signal from an ROI sampling the signal that is from the opposite imaging region measured in magnitude reconstructed images was 4.3 times mean background noise and 2.0% of maximum signal from the back region, and in the front region inappropriate signal was 2.9 times mean background noise and 1.4% of maximum signal.

Stray signal observed in the coronal images in FIG. 19 was also entirely from the opposite region. The slices labeled 6 were the most straightforward to analyze since the overlapping slices were easy to distinguish. Slice 6 of the back region had mean signal from the opposite region (stray signal) measured at 4.0 times the mean level of noise. Slice 6 of the front region was similar with stray signal 5.1 times the mean noise. The mean percent stray signal relative to the maximum for slice 6 front and back was 3.2% and 4.4%.

It should be noted that none of the images acquired using the double-region insert gradients were corrected for gradient-field inhomogeneities. Due to the difficulty of sorting out gradient linearity from field shimming, phantom and insert placement we have not attempted to quantify gradient linearity here. However, it can be seen from comparison of coronal slices of FIGS. 17a and 19 that qualitatively our double region insert has better linearity over the imaged volume than the manufacturers' gradients and from the uncorrected axial and coronal images of FIGS. 18 and 19 the overall linearity is quite good.

We have shown that imaging can be performed simultaneously in two separate imaging regions of the gradient insert without significant crosstalk between the two regions. Additionally, stray signal detected is most likely due to the proximity of RF system components to the RF shield and RF traps rather than shortcomings of the gradient insert. Separate RF coils in each region of the insert are necessary to isolate received signal coupling from the two different regions.

It was determined when stray signal from the opposite region was contaminating images. Stray signal could easily be determined when it did not overlap signal from the appropriate region, however, ROIs chosen in appropriate areas may have some small signal from the central or opposite regions that can not be sorted out. Also, since surface coils were used for transmit and receive, the image signal is heavily determined by the sensitivity of the surface coils, so comparisons of maximum or even mean signal is more qualitative than we would like.

Notice the polarity is reversed in the front region as expected. Very little unwanted signal from the central region was evident (<5% of signal of the desired region) as well as stray signal from the opposite region (<5% of signal of the desired region). Eddy current compensation does not seem to be a problem, probably due to the distance between our insert and conducting surfaces within the magnet. Field shimming issues remain to be addressed.

The double region gradient coil can be combined with another gradient set to image the central region. Images acquired in each region could be "stitched" together for a combined extended FOV image.

It will be also appreciated by persons skilled in the art that numerous variations and/or modifications may be made to the specific embodiments disclosed herein, without departing from the scope or spirit of the disclosure as broadly described. The present embodiments are, therefore, to be considered in all respects illustrative and not restrictive of the present inventions.

What is claimed is:

1. A method of magnetic resonance imaging comprising:
   positioning an insert gradient system within a bore of a magnetic resonance imaging (MRI) system, the MRI system comprising a body gradient system;
   placing a subject to be imaged within the insert gradient system;
   transmitting a radio frequency (RF) pulse sequence into the subject;
   driving the insert gradient system and the body gradient system concurrently with currents to produce a composite magnetic field gradient within the subject, wherein the composite magnetic field gradient includes at least one of (i) a composite readout gradient comprising a combination of a first readout gradient from the body gradient system and a second readout gradient from the insert gradient system, (ii) a composite phase encoding gradient comprising a combination of a first phase encoding gradient from the body gradient system and a second phase encoding gradient from the insert gradient system, or (iii) a composite slice select gradient comprising a combination of a first slice select gradient from the body gradient system and a second slice select gradient from the insert gradient system, or any combination of (i), (ii), and (iii);
   after the driving, receiving signals emitted from the subject; and
   processing the received signals into an MRI image of the subject.

2. The method of claim 1, wherein the driving the insert gradient system and the body gradient system further comprises:
   driving the body gradient system with a current to produce a body magnetic field gradient within the subject; and
   driving the insert gradient system with a current to produce an insert magnetic field gradient within the subject having approximately the same waveform shapes and timing as has the body magnetic field gradient;

wherein the composite magnetic field gradient comprises a combination of the body magnetic field gradient and the insert magnetic field gradient.

3. The method of claim 2, wherein the composite gradient has an amplitude of at least twice an amplitude of the body gradient.

4. The method of claim 2, wherein the composite magnetic field gradient comprises a combination of the body magnetic field gradient and the insert magnetic field gradient over the same space within the insert gradient system.

5. The method of claim 1, wherein the RF pulse sequence and composite magnetic field gradient are based on an imaging sequence comprising at least one of an echoplanar imaging sequence, a turbo spin echo imaging sequence, and a stead state free precession imaging sequence.

6. The method of claim 1, further comprising, while the insert gradient system is positioned within the bore of the MRI system, driving the body gradient system with the insert gradient system substantially turned off to obtain another MRI image of the subject.

7. The method of claim 1, further comprising driving the insert gradient system with the body gradient system substantially turned off to obtain another MRI image of the subject.

8. The method of claim 1, wherein the positioning the insert gradient system within the bore of the MRI system comprises placing the insert gradient system on a table configured to slide within the bore of the MRI system.

9. A magnetic resonance imaging (MRI) system, comprising:
   a body gradient system;
   a bore;
   an insert gradient system positioned within the bore and configured to permit a subject to fit within the insert gradient system;
   a transmitter that transmits a radio frequency (RF) pulse sequence into the subject; and
   a plurality of gradient drivers configured to drive the insert gradient system and the body gradient system concurrently with currents to produce a composite magnetic field gradient in the subject, wherein the composite magnetic field gradient includes at least one of (i) a composite readout gradient comprising a combination of a first readout gradient from the body gradient system and a second readout gradient from the insert gradient system, (ii) a composite phase encoding gradient comprising a combination of a first phase encoding gradient from the body gradient system and a second phase encoding gradient from the insert gradient system, or (iii) a composite slice select gradient comprising a combination of a first slice select gradient from the body gradient system and a second slice select gradient from the insert gradient system, or any combination of (i), (ii), and (iii);
   wherein the MRI system is configured to (a) receive RF signals emitted from the subject after the composite field gradient is produced in the subject, and (b) process the received signals into an MRI image of the subject.

10. The MRI system of claim 9, wherein the plurality of drivers are configured to drive the body magnetic field gradient with a current to produce a body magnetic field gradient, and to drive the insert magnetic field gradient with a current to produce an insert magnetic field gradient having approximately the same waveform shapes and timing as the body magnetic field gradient, wherein the composite magnetic field gradient comprises a combination of the body magnetic field gradient and the insert magnetic field gradient.

11. The MRI system of claim 10, wherein the composite gradient has an amplitude of at least twice an amplitude of the body gradient.

12. The MRI system of claim 10, wherein the composite magnetic field gradient comprises a combination of the body magnetic field gradient and the insert magnetic field gradient over the same space within the insert gradient system.

13. The MRI system of claim 9, wherein the RF pulse sequence and composite magnetic field gradient are based on an imaging sequence comprising at least one of an echoplanar imaging sequence, a turbo spin echo imaging sequence, and a stead state free precession imaging sequence.

* * * * *